(12) United States Patent  
Shokrollahi

(10) Patent No.: US 7,451,377 B2  
(45) Date of Patent: *Nov. 11, 2008

(54) ERROR-CORRECTING MULTI-STAGE CODE GENERATOR AND DECODER FOR COMMUNICATION SYSTEMS HAVING SINGLE TRANSMITTERS OR MULTIPLE TRANSMITTERS

(75) Inventor: M. Amin Shokrollahi, San Jose, CA (US)

(73) Assignee: Digital Fountain, Inc., Fremont, CA (US)

( * ) Notice: Subject to any disclaimer, the term of this patent is extended or adjusted under 35 U.S.C. 154(b) by 63 days.

This patent is subject to a terminal disclaimer.

(21) Appl. No.: 11/538,906

(22) Filed: Oct. 5, 2006

(65) Prior Publication Data

US 2007/0101234 A1 May 3, 2007

Related U.S. Application Data

(63) Continuation of application No. 10/960,790, filed on Oct. 6, 2004, now Pat. No. 7,139,960.

(60) Provisional application No. 60/509,355, filed on Oct. 6, 2003.

(51) Int. Cl. *H03M 13/00* (2006.01)

(52) U.S. Cl. ................................ 714/752; 714/777

(58) Field of Classification Search ......... 714/800–801, 714/762, 788, 752, 777, 786, 792, 794–795; 375/262, 265, 341; 711/200
See application file for complete search history.

(56) References Cited

U.S. PATENT DOCUMENTS

| 5,465,318 A * | 11/1995 | Sejnoha ........................ 704/243 |
| 7,010,052 B2 * | 3/2006 | Dill et al. ..................... 375/265 |
| 7,139,960 B2 * | 11/2006 | Shokrollahi ................. 714/752 |
| 2003/0086515 A1 * | 5/2003 | Trans et al. ................. 375/346 |

* cited by examiner

*Primary Examiner*—Guy J Lamarre  
(74) *Attorney, Agent, or Firm*—Philip H. Albert; Townsend and Townsend and Crew

(57) ABSTRACT

A communications system includes an encoder that produces a plurality of redundant symbols. For a given key, an output symbol is generated from a combined set of symbols including the input symbols and the redundant symbols. The output symbols are generally independent of each other, and an effectively unbounded number of output symbols can be generated, if needed. Received output symbols can provide probabilistic information for error correction. A decoder calculates check symbols from the output symbols received. For each received output symbol, the decoder updates a running total of estimated information content and, in one or more rounds, generates a probability distribution for each input symbol over all or some of possible values. This process may be repeated until, for all of the input symbols, one of the many possible values is much more probable than others, or the process may be repeated a predetermined number of rounds, or other criteria is met.

28 Claims, 15 Drawing Sheets

ERROR-CORRECTING MULTI-STAGE CODE GENERATOR AND DECODER FOR COMMUNICATION SYSTEMS HAVING SINGLE TRANSMITTERS OR MULTIPLE TRANSMITTERS

CROSS-REFERENCES TO RELATED APPLICATIONS

This application is a continuation of application Ser. No. 10/960,790 filed Oct. 6, 2004 now U.S. Pat. No. 7,139,960 issued Nov. 21, 2006 which claims the benefit of U.S. Provisional Application No. 60/509,355 filed Oct. 6, 2003, entitled "Error-Correcting Multi-Stage Code Generator And Decoder For Communication Systems Having Single Transmitters Or Multiple Transmitters Error," the entire disclosures of these applications are incorporated herein by reference for all purposes.

The present disclosure is related to the following commonly assigned applications/patents: U.S. Pat. No. 6,307,487 to Michael G. Luby [U.S. patent application Ser. No. 09/246,015, filed Feb. 5, 1999] entitled "Information Additive Code Generator and Decoder for Communication Systems" (hereinafter "Luby I"), U.S. Pat. No. 7,068,729 to M. Amin Shokrollahi et al [U.S. patent application Ser. No. 10/032,156, filed Dec. 21, 2001] entitled "Multi-Stage Code Generator and Decoder for Communication Systems" (hereinafter "Shokrollahi I"), and U.S. Pat. No. 6,909,383 to M. Amin Shokrollahi et al [U.S. patent application Ser. No. 10/677,624, filed Oct. 1, 2003] and entitled "Systematic Encoding and Decoding of Chain Reaction Codes" (hereinafter "SED-CRC"). The respective disclosures of these applications/patents are hereby incorporated by reference, as if set forth in full in this document, for all purposes.

BACKGROUND OF THE INVENTION

Transmission of data between a sender and a recipient over a communications channel has been the subject of much literature. Preferably, but not exclusively, a recipient desires to receive an exact copy of data transmitted over a channel by a sender with some level of certainty. Where the channel does not have perfect fidelity (which covers most of all physically realizable systems), one concern is how to deal with data lost or garbled in transmission. Lost data (erasures) are often easier to deal with than corrupted data (errors) because the recipient cannot always tell when corrupted data is data received in error. Many error-correcting codes have been developed to detect and/or correct for erasures and/or for errors. Typically, the particular code used is chosen based on some information about the infidelities of the channel through which the data is being transmitted and the nature of the data being transmitted. For example, where the channel is known to have long periods of infidelity, a burst error code might be best suited for that application. Where only short, infrequent errors are expected, a simple parity code might be best.

Data transmission between multiple senders and/or multiple receivers over a communications channel has also been the subject of much literature. Typically, data transmission from multiple senders requires coordination among the multiple senders to allow the senders to minimize duplication of efforts. In a typical multiple sender system sending data to a receiver, if the senders do not coordinate which data they will transmit and when, but instead just send segments of the file, it is likely that a receiver will receive many useless duplicate segments. Similarly, where different receivers join a transmission from a sender at different points in time, a concern is how to ensure that all data the receivers receive from the sender is useful. For example, suppose the sender wishes to transmit a file, and is continuously transmitting data about the same file. If the sender just sends segments of the original file and repeats and some segments are lost, it is likely that a receiver will receive many useless duplicate segments before receiving one copy of each segment in the file. Similarly, if a segment is received in error multiple times, then the amount of information conveyed to the receiver is much less than the cumulative information of the received garbled data. Often this leads to undesirable inefficiencies of the transmission system.

Often data to be transmitted over a communications channel is partitioned into equal size input symbols. The "size" of an input symbol can be measured in bits, whether or not the input symbol is actually broken into a bit stream, where an input symbol has a size of M bits when the input symbol is selected from an alphabet of $2^M$ symbols or other alphabet with other than $2^M$ symbols for an integer M.

A coding system may produce output symbols from the input symbols. Output symbols are elements from an output symbol alphabet. The output symbol alphabet may or may not have the same characteristics as the alphabet for the input symbols. Once the output symbols are created, they are transmitted to the receivers.

The task of transmission may include post-processing of the output symbols so as to produce symbols suitable for the particular type of transmission. For example, where transmission constitutes sending the data from a wireless provider to a wireless receiver, several output symbols may be lumped together to form a frame, and each frame may be converted into a wave signal in which the amplitude or the phase is related to the frame. The operation of converting a frame into a wave is often called modulation, and the modulation is further referred to as phase or amplitude modulation depending on whether the information of the wave signal is stored in its phase or in its amplitude. Nowadays, this type of modulated transmission is used in many applications, such as wireless transmission, satellite transmission, cable modems, Digital Subscriber Lines (DSL), and many others.

A transmission is called reliable if it allows the intended recipient to recover an exact copy of the original data even in the face of errors and/or erasures during the transmission. Recovery of erased information has been the subject of much literature and very efficient coding methods have been devised in this case.

One solution that has been proposed to solve the transmission problem is to use Forward Error-Correction (FEC) codes, such as Reed-Solomon codes, Tornado codes, or, more generally, LDPC (low-density parity-check) codes, or Turbo codes to increase reliability. With LDPC coding, sent output symbols are generated from the content instead of just the input symbols that constitute the content. Traditional error correcting codes, such as Reed-Solomon, LDPC, or Turbo codes, generate a fixed number of output symbols for a fixed length content. For example, for K input symbols, N output symbols might be generated. These N output symbols may comprise the K original input symbols and N-K redundant symbols. If storage permits, the sender can compute the set of output symbols for each piece of data only once and transmit the output symbols using a carousel protocol.

One problem with some FEC codes is that they require excessive computing power or memory to operate. Another problem is that the number of output symbols must often be determined in advance of the coding process. This can lead to inefficiencies if the error rate of the symbols is overestimated and can lead to failure if the error rate is underestimated. As a result, traditional FEC schemes often require a mechanism to estimate the reliability of the communications channel on which they operate. For example, in a wireless transmission system, the sender and the receiver might need to probe a communications channel so as to obtain an estimate of the noise and hence of the reliability of the channel. In such a case, this probing has to be repeated quite often, since the actual noise is a moving target due to rapid and transient changes in the quality of the communications channel.

For traditional FEC codes, the number of possible output symbols that can be generated is of the same order of magnitude as the number of input symbols the content is partitioned into. Typically, but not exclusively, most or all of these output symbols are generated in a preprocessing step before the sending step. These output symbols have the property that all the input symbols can be regenerated from any subset of the output symbols which, in aggregate, have the same amount of information as the original content.

As discussed above, one problem with many error-correcting codes is that they require excessive computing power or memory to operate. One coding scheme recently developed for communications applications that is somewhat efficient in its use of computing power and memory is the LDPC coding scheme. LDPC codes are similar to Reed-Solomon codes in that input data is represented by K input symbols and is used to determine N output symbols, where N is fixed before the encoding process begins. Encoding with LDPC codes is generally much faster than encoding with Reed-Solomon codes, as the average number of arithmetic operations required to create the N LDPC output symbols is proportional to N (on the order of tens of assembly code operations times N) and the total number of arithmetic operations required to decode the entire data is also proportional to N.

LDPC codes have speed advantages over Reed-Solomon codes. However, both LDPC and Reed-Solomon codes have several disadvantages. First, the number of output symbols, N, must be determined in advance of the coding process. This leads to inefficiencies if the error rate of symbols is overestimated, and can lead to failure if the error rate is underestimated. This is because an LDPC decoder requires reception of a certain number of output symbols to decode and restore the original data and if the number of erased symbols is greater than what the code was provisioned for, then the original data cannot be restored. This limitation is generally acceptable for many communications problems, so long as the rate of the code is selected properly, but this requires an advance guess at the error rate of the symbol reception of the channel.

Another disadvantage of LDPC codes is that they require the encoder and decoder to agree in some manner on a graph structure. LDPC codes require a pre-processing stage at the decoder where this graph is constructed, a process that may slow the decoding substantially. Furthermore, a graph is specific to a data size, so a new graph needs to be generated for each data size used. Furthermore, the graphs needed by the LDPC codes are sometimes complicated to construct, and require different custom settings of parameters for different sized data to obtain the best performance. These graphs may be of significant size and may require a significant amount of memory for their storage at both the sender and the recipient.

In addition, LDPC codes generate exactly the same output symbol values with respect to a fixed graph and input data. These output symbols may comprise the K original input symbols and N-K redundant symbols. Furthermore, values of N greater than a small multiple of K, such as 3 or 4 times K, are not practical. Thus, it is very likely that a recipient obtaining output symbols generated from the same input data using the same graph from more than one sender will receive a large number of duplicate output symbols, which would not be information additive. That is because 1) the N output symbols are fixed ahead of time, 2) the same N output symbols are transmitted from each transmitter each time the symbols are sent, 3) the same N symbols are received by a receiver and 4) N cannot practically exceed some small multiple of K. In effect, if uncoordinated output symbols are received from a number of transmitters, the probability that some output symbol has already been received is of the order of 1/sqrt(N), where sqrt(N) denotes the square root of N. Where K is on the order of N and K output symbols are needed, as more output symbols are received it becomes less and less likely that the next received output symbol would be information additive, which would not be the case if the number of possible output symbols were much larger than the number of output symbols needed to be received to decode the data.

Even though the output symbols from different transmitters may be corrupted in different ways, the total amount of information they convey to the system is not the sum of their respective amounts of information. For example, suppose that the symbols are one bit long, and the same LDPC code bit is received by a receiver from two different sources (such as two satellites), and that both bits have a probability p of being corrupt. Further suppose that one of the bits is received as 0, while the other one is received as 1. Then, the bits together do not give any information about the original LDPC bit, since the state of that bit is 0 or 1 each with probability of 50%. Each individual bit, however, gives some information about the original bit, but this information is not additive.

Therefore, what is needed is a simple error-correcting code that does not require excessive computing power or memory at a sender or recipient to implement, and that can be used to efficiently distribute data in a system with one or more senders and/or one or more recipients without necessarily needing coordination between senders and recipients.

BRIEF SUMMARY OF THE INVENTION

In one embodiment of a communications system according to the present invention, an encoder uses an input file of data to produce a plurality of redundant symbols, wherein the input file is an ordered plurality of input symbols each selected from an input alphabet, and the redundant symbols are from an alphabet of redundant symbols. For a given key, an output symbol is generated from a combined set of symbols including the input symbols and the redundant symbols, wherein the key is selected from a key alphabet, and the output symbol is selected from an output alphabet. An output symbol with key I is generated by determining a weight, W(I), for the output symbol to be generated, wherein the weights W are positive integers that vary between at least two values over the plurality of keys, selecting W(I) of the input symbols associated with the output symbol according to a function of I, and generating the output symbol's value B(I) from a predetermined value function F(I) of the selected W(I) input symbols. In some cases, the key is implicit in the state of the encoder. The output symbols are generally independent of each other, and an effectively unbounded number of output symbols (subject to the resolution of I) can be generated, if needed. The output symbols are information additive such that a received output symbol is likely to provide additional information for decoding even when many symbols are already received. The output symbols are such that a collection of received output symbols can provide probabilistic information to support error correction.

In a decoder according to embodiments of the present invention, the decoder can correctly decode the input symbols even when it only receives an arbitrary portion of the transmitted output symbols, and even if a substantial number of the received output symbols are in error. The input data can be decoded from any set of output symbol bits whose cumulative information is equal to, or slightly greater than, the number of input symbol bits comprising the file.

In a specific decoding embodiment, prior to, or substantially concurrent with reception of output symbols, the decoder calculates check symbols from the output symbols received, wherein each check symbol is associated with one or more input symbols and redundant symbols and wherein the weight of the check symbol is the number of symbols from the plurality of input symbols and redundant symbols that it is associated with, and the decoder stores the weight for the symbol and the positions of the associated symbols in a table. For each received output symbol, following the generation of check symbols and storage, the decoder performs various steps, including 1) calculating or estimating an amount of information in the received output symbol and updating a running total of information content, 2) identifying, a key I and a received output symbol value B(I) for the output symbols, 3) determining a weight, W(I), of the output symbol, and positions for W(I) associated symbols from the plurality of input symbols and redundant symbols associated with the output symbol, and 4) storing the weight W(I) and positions. For a recovery process, repeated until all the input symbols are recovered, until a predetermined number of rounds complete, or until other termination conditions are met, performing various steps, including for each of the input symbols, generating a probability distribution over all or some of the possible values of input symbols is determined wherein the probability distribution represents the probability of the input symbol having a particular possible value. The probability distribution is updated at every round based on the calculated probabilities of the previous round. This process may be repeated until, for all of the input symbols, one of the many possible values is much more probable than others, or the process may be repeated a predetermined number of rounds, or other criteria is met. The updating can take into account already decoded symbols, additional output symbols and the check symbols.

According to yet another embodiment of the invention, a computer data signal embodied in a carrier wave is provided. The computer data signal is usable for error corrections and includes a plurality of output symbols, wherein the plurality of output symbols represents symbols generated from a combined set of symbols including an ordered set of input symbols and the redundant symbols, wherein the redundant symbols are generated from the input symbols, wherein the number of possible output symbols is much larger than the number of symbols in the combined set of symbols, wherein at least one output symbol is generated from more than one symbol in the combined set of symbols and from less than all of the symbols in the combined set of symbols, and such that a receiver of the data signal can regenerate the ordered set of input symbols to a desired degree of accuracy from any predetermined number of the output symbols.

Numerous benefits are achieved by way of the present invention. For example, in a specific embodiment, the computational expense of encoding data for transmission over a channel is reduced. In another specific embodiment, the computational expense of decoding such data is reduced. Depending upon the embodiment, one or more of these benefits may be achieved. These and other benefits are provided in more detail throughout the present specification and more particularly below.

A further understanding of the nature and the advantages of the inventions disclosed herein may be realized by reference to the remaining portions of the specification and the attached drawings.

DETAILED DESCRIPTION OF THE INVENTION

Figure 1:
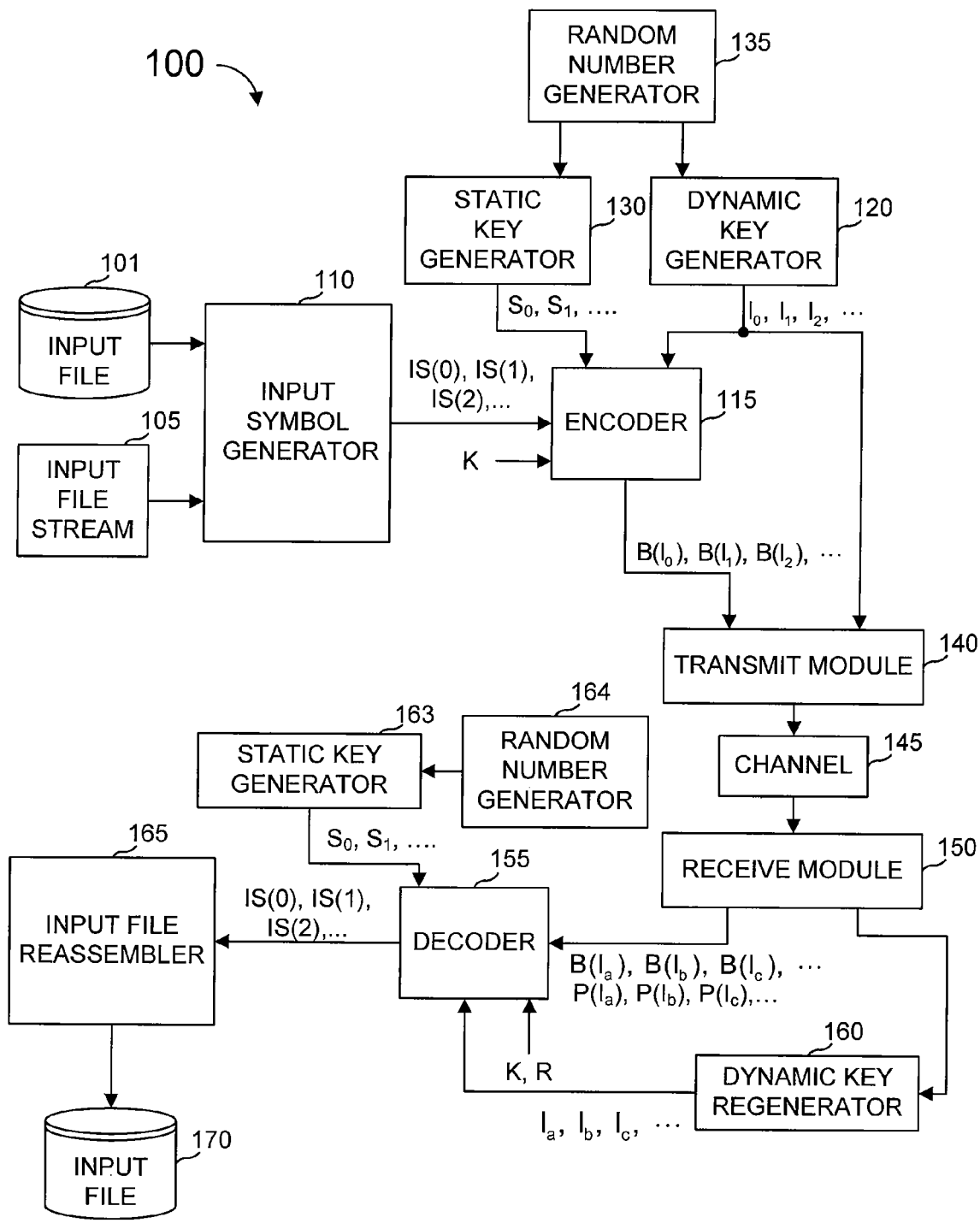
FIG. 1 is a block diagram of a communications system according to one embodiment of the present invention.

In the specific embodiments described herein, a coding scheme denoted as "error-correcting multi-stage coding" ("EC-MS") is described, preceded by an explanation of the meaning and scope of various terms used in this description. Luby I and Shokrollahi I provide teachings of systems and methods that can be employed in certain embodiments according to the present invention. It is to be understood, however, that these systems and methods are not required of the present invention, and many other variations, modifications, or alternatives can also be used. Some variations of EC-MS and multi-stage coding might be used in products marketed as Digital Fountain Raptor code systems.

With EC-MS coding, output symbols are generated by the sender from the input file as needed. Each output symbol can be generated without regard to how other output symbols are generated. At any point in time, the sender can stop generating output symbols and there need not be any constraint as to when the sender stops or resumes generating output symbols. Once generated, these symbols can then be transmitted to their destination either individually, or as part of a larger group (a "frame"), with each frame containing one or more output symbols.

As used herein, the term "file" refers to any data that is stored at one or more sources and is to be delivered as a unit to one or more destinations. Thus, a document, an image, and a file from a file server or computer storage device, are all examples of "files" that can be delivered. Files can be of known size (such as a one megabyte image stored on a hard disk) or can be of unknown size (such as a file taken from the output of a streaming source). Either way, the file is a sequence of input symbols, where each input symbol has a position in the file and a value.

Transmission is the process of transmitting data from one or more senders to one or more recipients through a channel in order to deliver a file. If one sender is connected to any number of recipients by a perfect channel, the received data can be an exact copy of the input file, as all the data will be received correctly. Here, we assume that the channel is not perfect, which is the case for most real-world channels, or we assume that the data emanates from more than one sender, which is the case for some systems. Of the many channel imperfections, the imperfections of interest are data errors and data incompleteness.

Data errors occur when the channel modifies the transmitted data. The modification can be due to a number of factors, such as atmospheric discharges in case of satellite transmission, loss of a signal power in case of wireless transmission, scratches on the surface of a compact disc or other digital storage media, etc.

Data incompleteness occurs when a recipient doesn't start receiving data until some of the data has already passed it by, the recipient stops receiving data before transmission ends, or the recipient intermittently stops and starts again receiving data. As an example of data incompleteness, a moving satellite sender might be transmitting data representing an input file and start the transmission before a recipient is in range. Once the recipient is in range, data can be received until the satellite moves out of range, at which point the recipient can redirect its satellite dish (during which time it is not receiving data) to start receiving the data about the same input file being transmitted by another satellite that has moved into range.

In some communication systems, a recipient receives data generated by multiple senders, or by one sender using multiple connections. For example, to speed up a download, a recipient might simultaneously connect to more than one sender to transmit data concerning the same file. As another example, in a broadcast transmission, multiple broadcast data streams might be transmitted to allow recipients to connect to one or more of these streams to match the aggregate transmission rate with the bandwidth of the channel connecting them to the sender. In all such cases, a concern is to ensure that all transmitted data is of independent use to a recipient, i.e., that the multiple source data is among the streams independently add their information to the system, even when the transmission rates are vastly different for the different streams, and when there are arbitrary patterns and intensities of error.

In general, transmission is the act of moving data from a sender to a recipient over a channel connecting the sender and recipient. The channel could be a real-time channel, where the channel moves data from the sender to the recipient as the channel gets the data, or the channel might be a storage channel that stores some or all of the data in its transit from the sender to the recipient. An example of the latter is disk storage or other storage device. In that example, a program or device that generates data can be thought of as the sender, transmitting the data to a storage device. The recipient is the program or device that reads the data from the storage device. The mechanisms that the sender uses to get the data onto the storage device, the storage device itself and the mechanisms that the recipient uses to get the data from the storage device collectively form the channel. If there is a chance that those mechanisms or the storage device can lose data, then that would be treated as data erasure in the channel.

When the sender and recipient are separated by a data error channel, it is preferable not to merely transmit an exact copy of an input file, but instead to transmit data generated from the input file that assists with recovery of errors. An encoder is a circuit, device, module or code segment that handles that task. One way of viewing the operation of the encoder is that the encoder generates output symbols from input symbols, where a sequence of input symbol values represent the input file. Each input symbol would thus have a position, in the input file, and a value. A decoder is a circuit, device, module or code segment that reconstructs the input symbols from the output symbols received by the recipient, even when some or a substantial number of output symbols are received in error.

Chain reaction codes, such as those described in Luby I or Shokrollahi I (showing multi-stage chain reaction codes), are efficient coding methods for recovery of erasures in a wide variety of settings. Chain reaction decoding is a form of forward error-correction that addresses the above issues when erasures are present. For chain reaction codes, the pool of possible output symbols that can be generated is orders of magnitude larger than the number of the input symbols (in most cases, effectively unbounded), and a random output symbol from the pool of possibilities can be generated very quickly. For chain reaction codes, the output symbols can be generated on the fly on an "as needed" basis concurrent with the sending step.

Chain reaction codes have a property that all input symbols of the content can be regenerated from nearly all subsets of a set of randomly generated output symbols whose cumulative amount of information about what the original content was is equal to or slightly more information about what the original content was, with the probability of full regeneration becoming very high for only slightly more the equal information. Since many more output symbols can be generated than input symbols, a random sampling of the output symbols numbering on the order of input symbols would not likely overlap, and is thus "information additive".

Other descriptions of various chain reaction coding systems are described in U.S. patent application Ser. No. 09/668, 452, filed Sep. 22, 2000 and entitled "On Demand Encoding With a Window" and U.S. patent application Ser. No. 09/691, 735, filed Oct. 18, 2000 and entitled "Generating High Weight Output symbols Using a Basis", each of which is incorporated by reference herein for all purposes.

Some embodiments of a chain reaction coding system comprise an encoder and a decoder. Data may be presented to the encoder in the form of a block, or a stream, and the encoder may generate output symbols from the block or the stream on the fly. In some embodiments, for example those described in Shokrollahi I, data may be pre-encoded into static input symbols off-line using a static encoder, and the output symbols may be generated from the plurality of the original data symbols and the static input symbols.

In some embodiments of a chain reaction coding system, the encoding and the decoding process rely on a weight table. The weight table describes a probability distribution on the set of source symbols. That is, for any number W between 1 and the full number of input symbols, the weight table indicates a unique probability $P(W)$. It is possible that $P(W)$ is zero for substantially many values of W, in which case it may be desirable for the weight table to include only those weights W for which $P(W)$ is not zero.

In some embodiments of a chain reaction coding system, the output symbols are generated as follows: for every output symbol, a key is randomly generated. Based on the key, a weight W is computed from the weight table. Then, a random or pseudorandom subset of W source symbols is chosen. The output symbol will then be the XOR of these source symbols. These source symbols are called the neighbors or associates of the output symbol hereinafter. Various modifications and extensions of this basic scheme are possible and have been discussed in the above mentioned patents and patent applications.

Once an output symbol has been generated, it may be sent to the intended recipients along with its key, or an indication of how the key may be regenerated, or some source of common randomness that helps the receiver generate the same set of keys used to generate the output symbols.

In certain applications it may be preferable to transmit the input symbols first as output symbols, and then continue transmission by sending output symbols generated from the input symbols. Such a coding system is called a systematic coding system and is disclosed in Shokrollahi I.

EC-MS coding is not limited to any particular type of input symbol, but the type of input symbol is often dictated by the application. Typically, the values for the input symbols are selected from an alphabet of $2^M$ symbols for some positive integer M. In such cases, an input symbol can be represented by a sequence of M bits of data from the input file. The value of M is often determined based on the uses of the application and on the channel. For example, for a bit-based transmission channel, a symbol with a size of one bit might be appropriate. As another example, some communication systems use modulation to transmit several bits in one use of the channel. In such cases, it might be appropriate to put the symbol size to be equal to the number of bits that are transmitted in each use of the channel. For example, where Quaternary Phase Shift Keying (QPSK) is used as the modulation scheme, it may be advantageous to choose a symbol size equal to two bits. In a general-purpose communication system using EC-MS coding, the application-specific parameters, such as the input symbol size (i.e., M, the number of bits encoded by an input symbol), might be variables set by the application.

Each output symbol has associated with it a probability distribution which, for any element in the output symbol alphabet, determines a probability that the symbol has had that value prior to the transmission. These probabilities, or estimates thereof, may be extracted by calculating the distance of the received symbol from the set of valid symbols. For example, where the several bits are modulated into one frame, the demodulation step may provide an estimate of how accurate the demodulation step is. In some implementations, the estimate of accuracy is a binary value (e.g., "accurate" or "not accurate"). In other implementations, the estimate can take one of three, four, or more values.

In one preferred embodiment, which we consider below, each output symbol has an identifier called its "key." Preferably, the key of each output symbol can be easily determined by the recipient to allow the recipient to distinguish one output symbol from other output symbols. Preferably, the key of an output symbol is distinct from the keys of all other output symbols. Also, preferably as little data as possible is included in the transmission in order for a recipient to determine the key of a received output symbol. In some embodiments, the keys of the output symbols may be determined by a clock synchronization between the sender and the receiver, and by a unique shared number which helps in the reconstruction of the keys of individual output symbols.

In some systems, it is preferable to form a key from more than one piece of data. For example, consider a system that includes a recipient receiving more than one data stream generated from the same input file from one or more senders, where the transmitted data is a stream of packets, each containing one output symbol. In such a situation it is preferred that the key comprise a unique stream identifier paired with a sequence number.

Keying by the position of the output symbol is preferred when it is possible. Position keying might work well for reading output symbols from a storage device, such as a CD-ROM (Compact Disk Read-Only-Memory), where the key of an output symbol is its position on the CD-ROM (i.e., track, plus sector, plus location within the sector, etc.). Position keying might also work well for a transmission system in which the sender and the receiver have a synchronized clock. With this form of keying, the recipient can recreate the key of an output symbol with no space required for explicitly transmitting the key. Position keying, of course, requires that such position information be available and reliable.

Another form of keying that is preferred in some systems is random keying. In these systems, a random (or pseudo-random) number is generated, and used as the key for each output symbol. In preferred embodiments, the sender and the receiver agree on a common piece of data which allows the reconstruction of the same sequence of random keys. One property of random keying is that the fraction of keys that have the same value is likely to be small, even for keys generated by different senders at different physical locations (assuming the range of possible keys is large enough). This form of keying may have the advantage over other forms in some systems because of the simplicity of its implementation. It should be understood that, unless otherwise indicated, as used herein "random" values or "random" numbers refer to numbers that are truly randomly generated and also include pseudorandomly generated values or numbers.

As explained above, EC-MS coding is useful where there is an expectation of data error or where the recipient does not begin and end reception exactly when a transmission begins and ends. The latter condition is referred to herein as "data incompleteness". These conditions do not adversely affect the communication process when EC-MS coding is used, because the EC-MS coding data that is received is highly independent so that it is information additive. If most random collections of output symbols are independent enough to be largely information additive, which is the case for the EC-MS coding systems described herein, then any suitable number of output symbols whose cumulative information content is large enough can be used to recover an input file. With chain reaction coding, a receiver is not constrained to pickup any particular set of output symbols, so it can receive some output symbols from one transmitter, switch to another transmitter, receive some symbols in error, or even lose some symbols, miss the beginning or end of a given transmission and still recover an input file. The ability to join and leave a transmission without receiver-transmitter coordination greatly simplifies the communication process.

System Overview

FIG. 1 is a block diagram of a communications system 100 that uses EC-MS coding. In communications system 100, an input file 101, or an input stream 105, is provided to an input symbol generator 110. Input symbol generator 110 generates a sequence of one or more input symbols (IS(0), IS(1), IS(2), . . . ) from the input file or stream, with each input symbol having a value and a position (denoted in FIG. 1 as a parenthesized integer). As explained above, the possible values for input symbols, i.e., its alphabet, is typically an alphabet of $2^M$ symbols, so that each input symbol codes for M bits of the input file. The value of M is generally determined by the use of communication system 100, but a general purpose system might include a symbol size input for input symbol generator 110 so that M can be varied from use to use. The output of input symbol generator 110 is provided to an encoder 115.

Static key generator 130 produces a stream of static keys $S_0$, $S_1$, . . . . The number of the static keys generated is generally limited and depends on the specific embodiment of encoder 115. The generation of static keys will be subsequently described in more detail. Dynamic key generator 120 generates a dynamic key for each output symbol to be generated by the encoder 115. Each dynamic key is generated so that a large fraction of the dynamic keys for the same input file are unique. For example, Luby I describes embodiments of key generators that can be used. The outputs of dynamic key generator 120 and the static key generator 130 are provided to encoder 115. The operation of static key generator 130 might depend on random numbers generated by a random number generator 135.

From each key I provided by dynamic key generator 120, encoder 115 generates an output symbol, with a value B(I), from the input symbols provided by the input symbol generator. The operation of encoder 115 will be described in more detail below. The value of each output symbol is generated based on its key, on some function of one or more of the input symbols, and possibly one or more redundant symbols that had been computed from the input symbols. The collection of input symbols and redundant symbols that give rise to a specific output symbol is referred to herein as the output symbol's "associated symbols" or just its "associates". The selection of the function (the "value function") and the associates is done according to a process described in more detail below. Typically, but not always, M is the same for input symbols and output symbols, i.e., they both code for the same number of bits.

In some embodiments, the number K of input symbols is used by the encoder 115 to select the associates. If K is not known in advance, such as where the input is a streaming file, K can be just an estimate. The value K might also be used by encoder 115 to allocate storage for input symbols and any intermediate symbols generated by encoder 115.

Encoder 115 provides output symbols to a transmit module 140. Transmit module 140 may also be provided the key of each such output symbol from the dynamic key generator 120. Transmit module 140 transmits the output symbols, and depending on the keying method used, transmit module 140 might also transmit some data about the keys of the transmitted output symbols, over a channel 145 to a receive module 150. Channel 145 is assumed to be an error channel, but that is not a requirement for proper operation of communication system 100. Modules 140, 145 and 150 can be any suitable hardware components, software components, physical media, or any combination thereof, so long as transmit module 140 is adapted to transmit output symbols and any needed data about their keys to channel 145 and receive module 150 is adapted to receive symbols and potentially some data about their keys from channel 145. Receive module 150 may also incorporate an estimator which gives an estimate of the probability that the received output symbol's value was v at transmission, thus providing a probability estimate over possible v for each received output symbol. The value of K, if used to determine the associates, can be sent over channel 145, or it may be set ahead of time by agreement of encoder 115 and decoder 155.

Because channel 145 is assumed to be an error channel, and because errors may also be erasures, communications system 100 does not assume a one-to-one correspondence between the output symbols that exit receive module 150 and the output symbols that go into transmit module 140. In fact, where channel 145 comprises a packet network, communications system 100 might not even be able to assume that the relative order of any two or more packets is preserved in transit through channel 145. Therefore, the key of the output symbols is determined using one or more of the keying schemes described above, and not necessarily determined by the order in which the output symbols exit receive module 150.

Receive module 150 provides the output symbol values $B(I_a)$, $B(I_b)$, $B(I_c)$, . . . together with an estimate of their probabilities $P(I_a)$, $P(I_b)$, $P(I_c)$, . . . to a decoder 155, and any data receive module 150 receives about the keys of these output symbols is provided to a dynamic key regenerator 160. The probabilities are generally probability distributions on the set of possible output symbols. For example, where the output symbols represent bits, then the probability for an output bit might be equal to the probability that the output bit was a zero bit prior to the transmission (the probability that it was a one bit is just one minus the probability that it was a zero bit).

Dynamic key regenerator 160 regenerates the dynamic keys for the received output symbols and provides these dynamic keys to decoder 155. Static key generator 163 regenerates the static keys $S_0$, $S_1$, . . . and provides them to decoder 155. The static key generator receives numbers from a random number generator 164 or has access to random number generator 135 used both during the encoding and the decoding process. This access can be in the form of access to the same physical device if the random numbers are generated on such device, or in the form of access to the same algorithm for the generation of random numbers to achieve identical behavior in random number generator 164 as in random number generator 135. Decoder 155 uses the keys provided by dynamic key regenerator 160 and static key generator 163, together with the corresponding output symbols, to recover the input symbols (again IS(0), IS(1), IS(2), . . . ). Decoder 155 provides the recovered input symbols to an input file reassembler 165, which generates a copy 170 of input file 101 or input stream 105.

An Encoder

Figure 2:
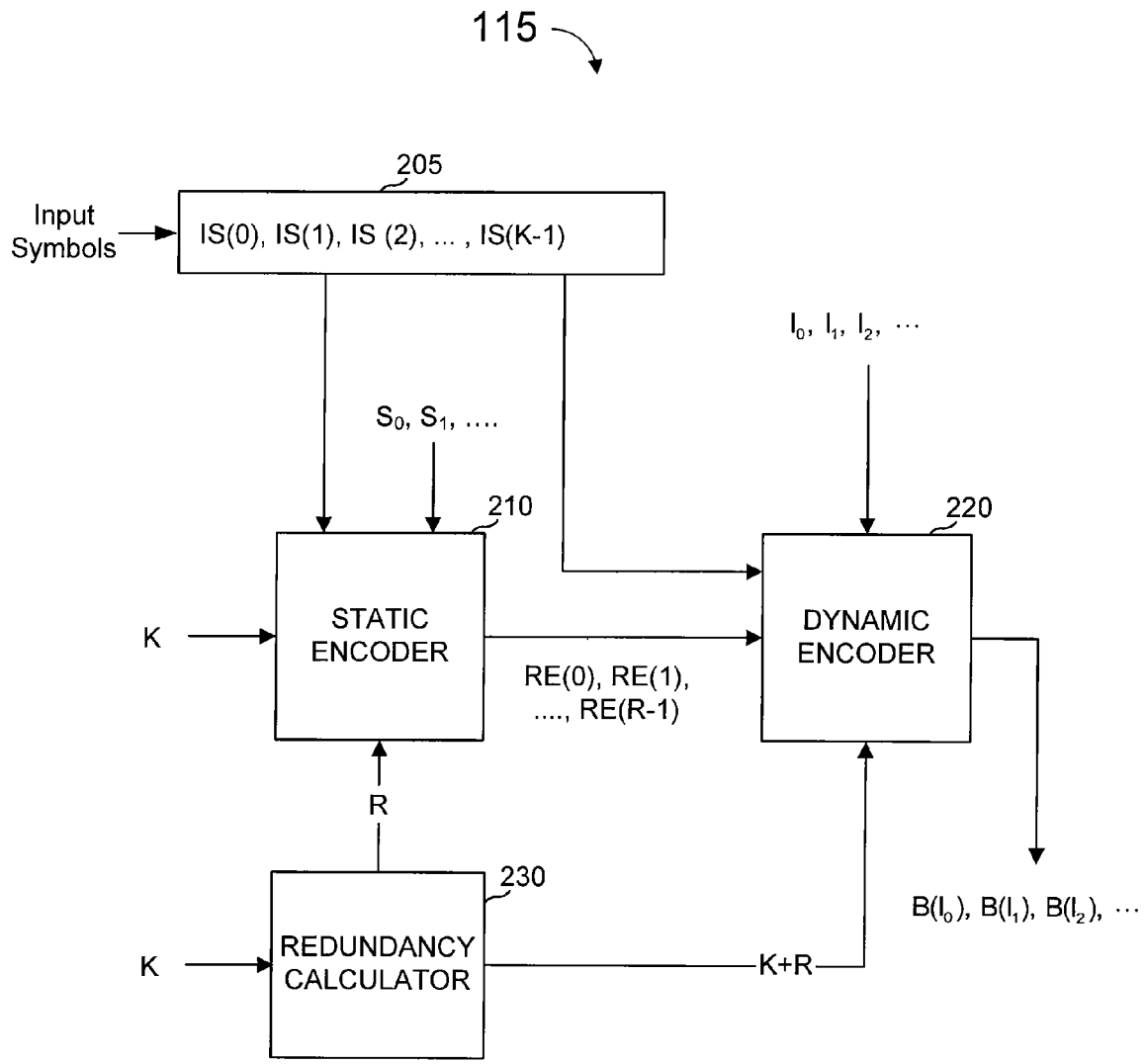
FIG. 2 is a block diagram showing the encoder of FIG. 1 in greater detail.

FIG. 2 is a block diagram of one specific embodiment of encoder 115 shown in FIG. 1. Encoder 115 comprises a static encoder 210, a dynamic encoder 220, and a redundancy calculator 230. Static encoder 210 receives the following inputs: a) original input symbols IS(0), IS(1), . . . , IS(K−1) provided by the input symbol generator 110 and stored in an input symbol buffer 205; b) the number K of original input symbols; c) static keys $S_0$, $S_1$, . . . provided by the static key generator 130; and d) a number R of redundant symbols. Upon receiving these inputs, static encoder 205 computes R redundant symbols RE(0), RE(1), . . . , RE(R−1) as will be described below. Typically, the redundant symbols have the same size as the input symbols. In one specific embodiment, the redundant symbols generated by static encoder 210 are stored in input symbol buffer 205. Input symbol buffer 205 may be only logical, i.e., the file may be physically stored in one place and the positions of the input symbols within symbol buffer 205 could only be renamings of the positions of these symbols within the original file.

Dynamic encoder 220 receives the input symbols and the redundant symbols, and generates output symbols as will be described in further detail below. In one embodiment in which the redundant symbols are stored in the input symbol buffer 205, dynamic encoder 220 receives the input symbols and redundant symbols from input symbol buffer 205.

Redundancy calculator 230 computes the number R of redundant symbols from the number K of input symbols. This computation is described in further detail below.

In situations where the speed of generating output symbols is a critical resource, the input file could be encoded using static encoder 210 and stored on an intermediate device before the transmission of output symbols starts. This device could be, for example, an attached storage device at a different physical location than dynamic encoder 220, or it could be included in the same physical device as dynamic encoder 220, etc. In the case where the file has been encoded with static encoder 210 well in advance of encoding with dynamic encoder 220, the computational device that implements dynamic encoder 220 need not devote resources to static encoding. Thus, it could devote more resources to dynamic encoding in order to, for example, increase the speed of generating output symbols for the input file, generate output symbols for other files, perform other tasks, etc. Whether or not static encoding can or should be performed in advance of dynamic encoding is dependent upon the particular implementation.

Overview of Static Encoder

Figure 3:
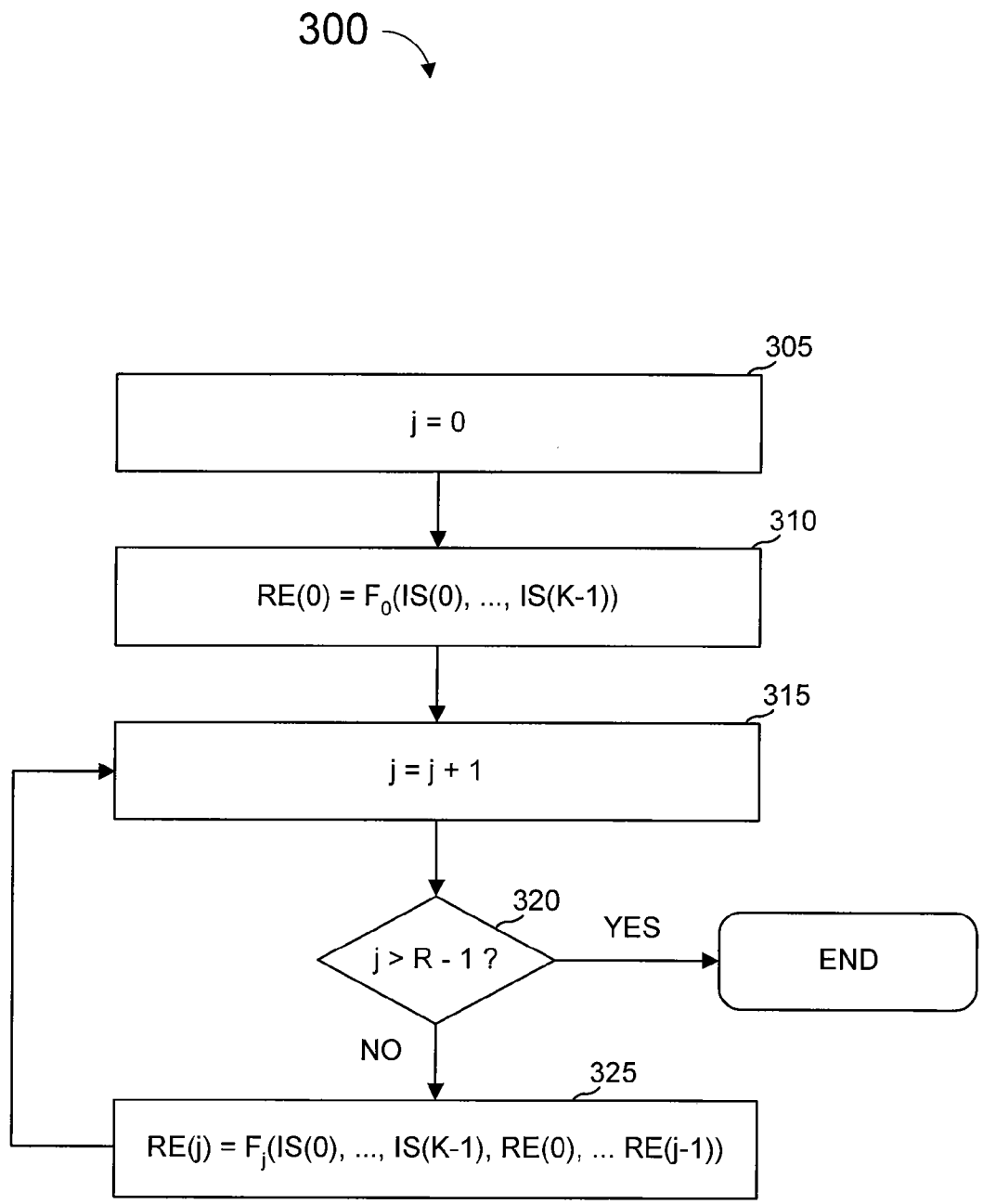
FIG. 3 is a simplified flow diagram illustrating one embodiment of a method of statically encoding.
Figure 4:
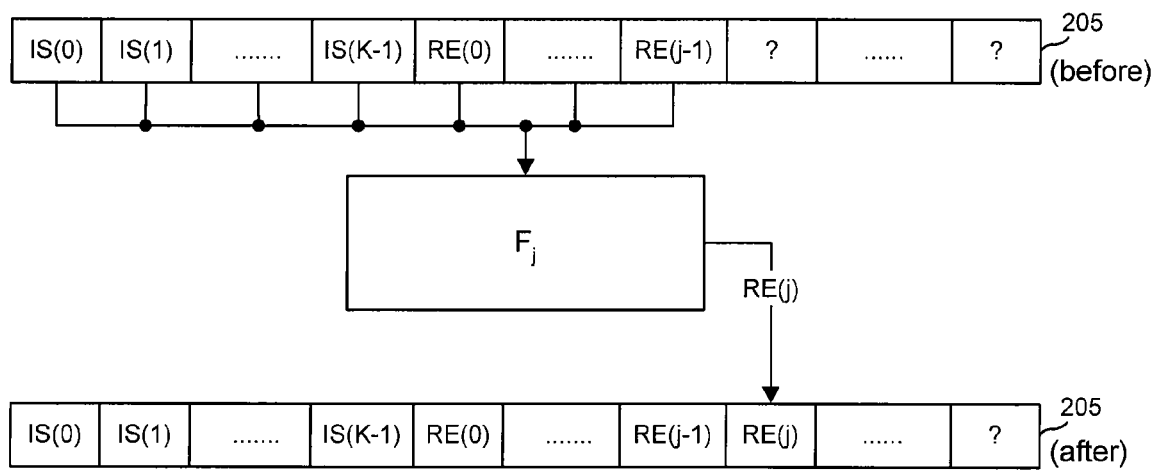
FIG. 4 is a diagram of one embodiment of the static encoder of FIG. 2.

The general operation of static encoder 210 will be described with reference to FIGS. 3 and 4. FIG. 3 is a simplified flow diagram illustrating one embodiment of a method of statically encoding. In a step 305, a variable j, which keeps track of how many redundant symbols have been generated, is set to zero. Then, in a step 310, a first redundant symbol RE(0) is computed as a function $F_0$ of the input symbols IS(0), . . . , IS(K−1). Then, in a step 315, the variable j is incremented. Next, in a step 320, it is tested whether all of the redundant symbols have been generated (i.e., is j greater than R−1?). If yes, then the flow ends. Otherwise, the flow proceeds to step 325. In step 325, RE(j) is computed as a function $F_j$ of the input symbols IS(0), . . . , IS(K−1) and of the previously generated redundant symbols RE(0), . . . , RE(j−1). Steps 315, 320, and 325 are repeated until R redundant symbols have been computed.

Referring again to FIGS. 1 and 2, in some embodiments, static encoder 210 receives one or more static keys $S_0$, $S_1$, . . . from static key generator 130. In these embodiments, the static encoder 210 uses the static keys to determine some or all of functions $F_0, F_1, \ldots F_{j-1}$. For example, static key $S_0$ can be used to determine function $F_0$, static key $S_1$ can be used to determine function $F_1$, etc. Alternatively, one or more of static keys $S_0$, $S_1$, . . . can be used to determine function $F_0$, one or more of static keys $S_0$, $S_1$, . . . can be used to determine function $F_1$, etc. In other embodiments, no static keys are needed, and thus static key generator 130 is not needed.

Referring now to FIGS. 2 and 3, in some embodiments, the redundant symbols generated by static encoder 210 can be stored in input symbol buffer 205. FIG. 4 is a simplified illustration of the operation of one embodiment of static encoder 210. Particularly, static encoder 210 generates redundant symbol RE(j) as a function Fj of input symbols IS(0), . . . , IS(K−1), RE(0), . . . , RE(j−1), received from input symbol buffer 205, and stores it back into input symbol buffer 205. The exact form of the functions $F_0, F_1, \ldots F_{R-1}$ depends on the particular application. Typically, but not always, functions $F_0, F_1, \ldots, F_{R-1}$ include an exclusive OR of some or all of their corresponding arguments. As described above, these functions may or may not actually employ static keys generated by static key generator 130 of FIG. 1. For example, in one specific embodiment described below, the first few functions implement a Hamming code and do not make any use of the static keys $S_0, S_1, \ldots$, whereas the remaining functions implement a Low-Density Parity-Check code and make explicit use of the static keys.

Overview of Dynamic Encoder

Figure 5:
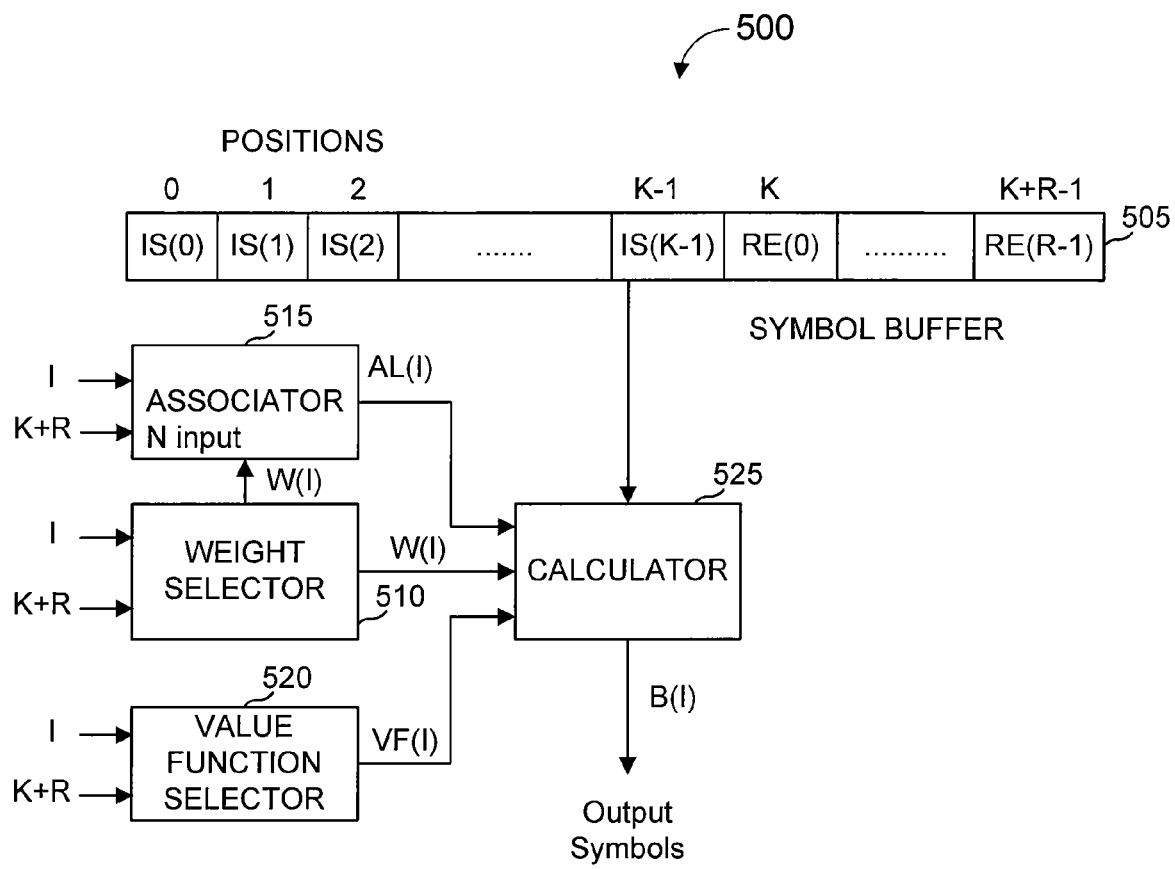
FIG. 5 is a simplified block diagram of one embodiment of the dynamic encoder of FIG. 2.

Referring again to FIG. 2, dynamic encoder 220 receives input symbols IS(0), . . . , IS(K−1) and the redundant symbols RE(0), . . . , RE(R−1) and a key I for each output symbol it is to generate. The collection comprising the original input symbols and the redundant symbols will be referred to as the collection of "dynamic input symbols" hereafter. FIG. 5 is a simplified block diagram of one embodiment of a dynamic encoder. This encoder is similar to embodiments of encoders described in Luby I. Luby I describes further details on the operation of such an encoder.

Dynamic encoder 500 includes a weight selector 510, an associator 515, a value function selector 520 and a calculator 525. As shown in FIG. 5, the K+R dynamic input symbols are stored in a dynamic symbol buffer 505. In one embodiment, dynamic symbol buffer 505 is input symbol buffer 205 of FIG. 2. In other embodiments, dynamic symbol buffer 505 is separate from input symbol buffer 205. Dynamic key I (provided by the dynamic key generator 120 shown in FIG. 1) is an input to weight selector 510, associator 515 and value function selector 520. The number of dynamic input symbols, K+R, is also provided to these three components, 510, 515 and 520. Calculator 525 is coupled to receive outputs from weight selector 510, associator 515 and value function selector 520, and to receive symbols from dynamic symbol buffer 505. Calculator 525 generates output symbol values. It should be understood that other equivalent arrangements to the elements shown in FIG. 5 might be used, and that this is but one example of an encoder according to the present invention. For instance, Luby I and Shokrollahi I describe other encoders that can be used in other embodiments according to the present invention.

In operation, the K+R dynamic input symbols are received from static encoder 210 and stored in dynamic input symbol buffer 505. As explained above, each dynamic input symbol has a position (for example, the position of an input symbol may be its original position in the input file) and a value. The dynamic input symbols need not be stored in dynamic input symbol buffer 505 in their respective order, so long as the position of stored dynamic input symbols can be determined.

Using key I and the number of dynamic input symbols K+R, weight selector 510 determines the number W(I) of dynamic input symbols that are to be "associates" of the output symbol having key I. Using key I, weight W(I), and the number of dynamic input symbols K+R, associator 515 determines a list AL(I) of positions of dynamic input symbols associated with the output symbol. It should be understood that W(I) need not be separately or explicitly calculated if associator 515 can generate AL(I) without knowing W(I) ahead of time. Once AL(I) is generated, W(I) can be easily determined because it is the number of associates in AL(I).

Associator 515 is a mapper that receives as input a key I, a number N, and a number t and produces a list X(0), . . . , X(t−1) of integers between 0 and N−1. Preferably, these integers are distinct and uniformly distributed on their range. For example, in the case of dynamic encoder 500 in FIG. 5, N is equal to K+R, t is equal to W(I), and AL(I) is the list X(0), . . . , X(t−1).

The mapping given by associator 515 can take a variety of forms. It can have access to a source of truly random or pseudorandom bits to make its output random. However, it should be chosen to produce the same output by both the encoder and the decoder for the same key I, the same N, and the same t. To satisfy this requirement, a pseudorandom sequence could be generated by both the encoder and the decoder seeded with the key I. Instead of a pseudorandom sequence, a truly random sequence might be used for computing the output, but for that to be useful, the random sequence used for generating the output would need to be communicated to the decoder.

Referring again to FIG. 5, once I, W(I) and AL(I) are known, the value B(I) of the output symbol is calculated by calculator 525 based on a value function VF(I). One property of a suitable value function is that it would allow the value for an associate indicated by AL(I) to be determined from output symbol value B(I) and from the values for the other W(I)−1 associates indicated by AL(I). One preferred value function used in this step is the XOR value function, since it satisfies this property, is easily computed and easily inverted. However, other suitable value functions might be used instead. For example, Luby I describes other suitable value functions that can be used.

If used, value function selector 520 determines a value function VF(I) from key I and from K+R. In one variation, the value function VF(I) is the same value function VF for all I. In that variation, value function selector 520 is not needed and calculator 525 can be configured with the value function VF. For example, the value function might be XOR for all I, i.e., the output symbol value is an XOR (exclusive OR) of the values of all of its associates.

For each key I, weight selector 510 determines a weight W(I) from I and K+R. In one variation, weight selector 510 selects W(I) by using the key I to first generate a random looking number and then uses this number to look up the value of W(I) in a distribution table that is stored within, or accessible by, weight selector 510. A more detailed description of how such a distribution table might be formed and accessed is described below. Once weight selector 510 determines W(I), this value is provided to associator 515 and to calculator 525.

Using list AL(I), weight W(I) and either the value function VF(I) provided by value function selector 520 or a preselected value function VF, calculator 525 accesses the W(I) dynamic input symbols referenced by AL(I) in dynamic input symbol buffer 505 to calculate the value, B(I), for the current output symbol. An example of a procedure for calculating AL(I) is described below, but another suitable procedure might be used instead. Preferably, the procedure gives each input symbol a roughly even chance of being selected as an associate for a given output symbol and does the selection in a way that the decoder can replicate if the decoder does not already have AL(I) available to it.

Figure 6:
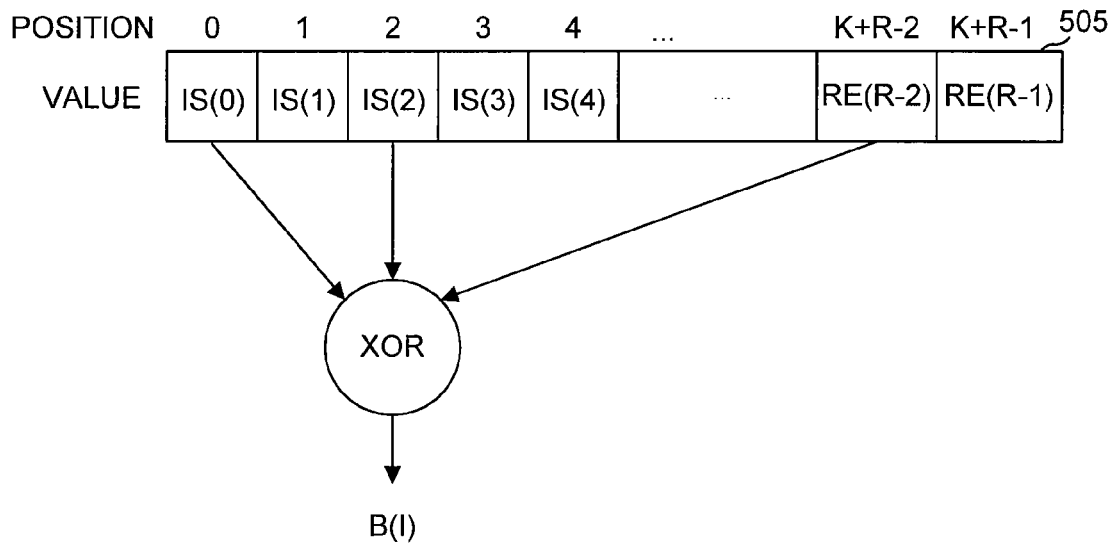
FIG. 6 is an illustration of a method and apparatus for generating an output symbol from a set of associated input symbols.

Dynamic encoder 500 then outputs B(I). In effect, dynamic encoder 500 performs the action illustrated in FIG. 6, namely, to generate an output symbol value B(I) as some value function of selected input symbols. In the example shown, the value function is XOR, the weight W(I) of the output symbol is 3, and the associated dynamic input symbols (the associates) are at positions 0, 2, and K+R−2 and have respective values IS(0), IS(2) and RE(R−2). Thus, the output symbol is calculated as:

$$B(I)=IS(0) \oplus IS(2) \oplus RE(R-2)$$

for that value of I. Where the value function XOR is used, it should be understood that the redundant symbols have the same number of bits as the original symbols IS((0), . . . , IS(K−1) and these in turn have the same number of bits as the output symbols.

The generated output symbols are then transmitted and received as described above. Herein, it is assumed that some of the output symbols might have been lost or gotten out of order, or were generated by one or more encoders. It is assumed, however, that the output symbols that are received have been received with an indication of their key and some assurance their values B(I) are accurate. As shown in FIG. 1, those received output symbols, together with their corresponding keys reconstructed from their indication by dynamic key regenerator 160, the values K and R, and the static keys $S_0, S_1, \ldots$ regenerated by static key generator 163, are the input to decoder 155. Decoder 155 might also receive and use probability indications indicating probabilities that the values B(I) were as transmitted.

Static Encoder

The main function of the static encoder is to add redundant information to the original data in such a way that recovery of the original data is possible in face of errors. Such redundant information can assist a decoder to recover the input symbols that a dynamic decoder could not recover. In typical applications, the static encoder should be efficient in terms of the number of redundant symbols required to guarantee recovery to a desired degree of accuracy in the face of erasures, and/or in terms of the computational expense of the encoding process and/or the decoding process. For instance, for a given target error rate p which is, in applications, dictated by the performance of the dynamic decoder, the aim is to make the number R of redundant symbols as small as possible while guaranteeing fast recovery of the original data if at most a fraction p of the data is in error.

A class of codes satisfying these requirements is that of LDPC codes, well-known to those skilled in the art. While these codes can recover the original data in many cases, there are infrequent occasions in which they recover everything but a small number of original input symbols. Thus, in some embodiments, prior to LDPC encoding, the input data is first encoded using a code that can recover the original data if there are a few errors. This first encoding generates a first plurality of redundant symbols. After this first encoding, the plurality of the original symbols and the first plurality of redundant symbols are encoded using an LDPC encoder. An example for the first layer of encoding is a BCH code, which is well-known to those skilled in the art. It is to be understood that other types of encoding can also be used such as, for example, a coding scheme using two layers or more than two layers.

Figure 7:
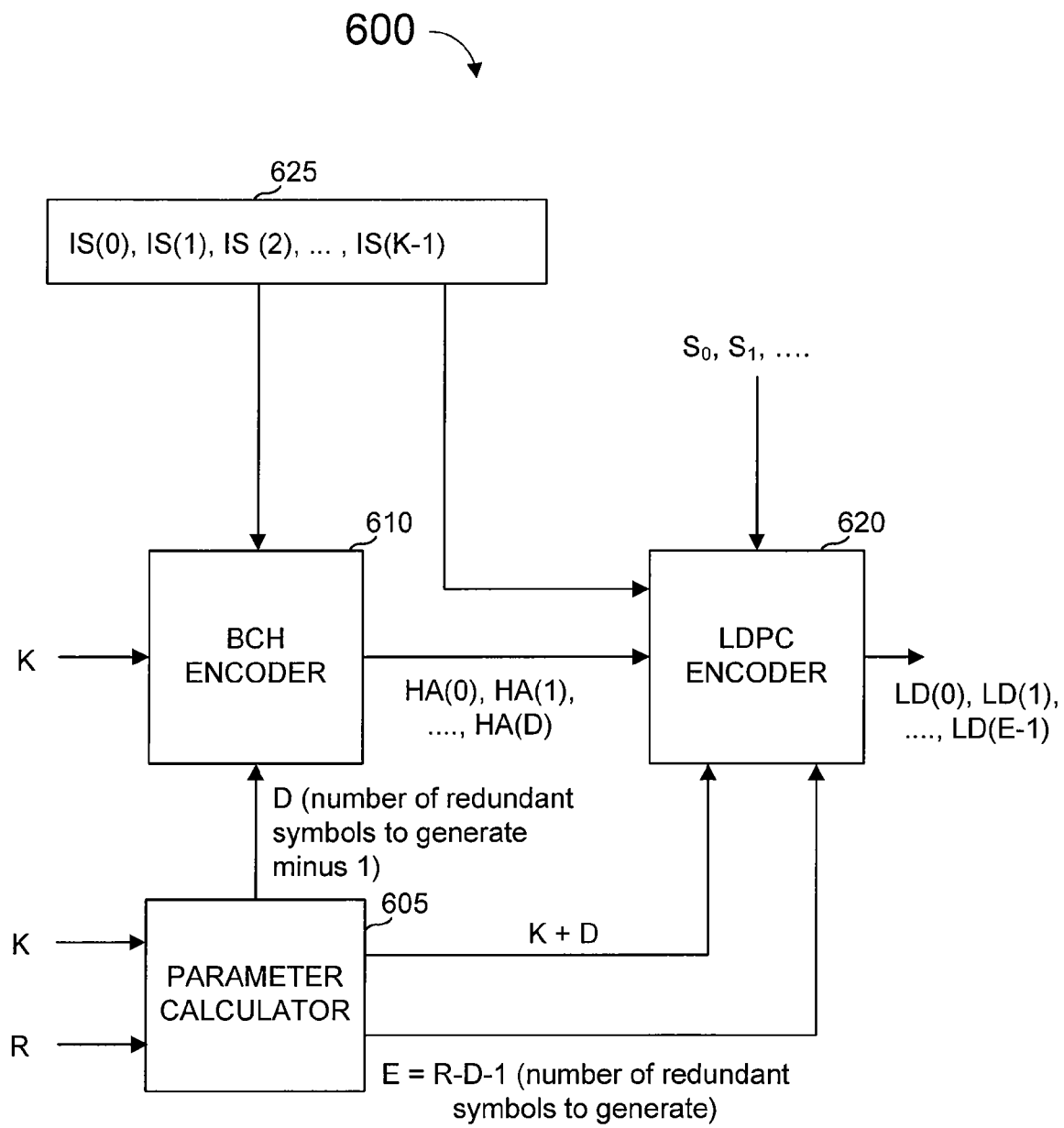
FIG. 7 is a simplified block diagram of one specific embodiment of a static encoder.

FIG. 7 is a simplified block diagram of one specific embodiment of a static encoder according to the present invention. Static encoder 600 comprises a parameter calculator 605, a BCH encoder 610, and a low-density-parity-check (LDPC) encoder 620. Parameter calculator 605 receives the number K of input symbols and the number R of redundant symbols to be generated, and generates parameters D and E. D is an indication of the number of redundant symbols to be generated by BCH encoder 610, and E is an indication of the number of redundant symbols to be generated by LDPC encoder 620. Parameter D is provided to BCH encoder 610 and parameter E is provided to LDPC encoder 620.

BCH encoder 610 is coupled to receive the input symbols IS(0),..., IS(K−1) from an input symbol buffer 625, the number K of input symbols, and the parameter D. In response, BCH encoder 610 generates D+1 redundant symbols HA(0), HA(1), ..., HA(D) according to a BCH code. In one embodiment, input symbol buffer 625 is input symbol buffer 205 of FIG. 2. The BCH encoding process adds D+1 redundant symbols to the original K input symbols, wherein D may depend on the application. Encoder 610 can be implemented in any number of ways known to those skilled in the art of error-correcting and erasure-correcting codes.

LDPC encoder 620 is coupled to receive the input symbols IS(0), ..., IS(K−1), the number K+D+1 of input symbols and BCH encoded redundant symbols, the parameter E, and static keys $S_0$, $S_1$, .... In response, LDPC encoder 620 generates E redundant symbols according to a LDPC code. The number E of redundant symbols calculated by the LDPC encoder is equal to R−D−1, wherein R is the number of redundant symbols. As is known to those skilled in the art, there are various ways of encoding information using LDPC codes. LDPC codes can be represented by a graph structure comprising a set of message nodes, a set of check nodes and edges connecting message nodes to check nodes. The set of valid LDPC codewords is the set of those settings of the message nodes such that for each check node, the XOR of the neighboring message nodes is zero. In certain applications, it is preferable for the message nodes to all have the same degree, i.e., to be connected to the same number of check nodes, as this simplifies the implementation of the encoder, and also makes the calculation of the error probability of the decoder easier. LDPC encoder 620 can be implemented in any number of ways known to those skilled in the art of error-correcting and erasure-correcting codes.

Figure 8:
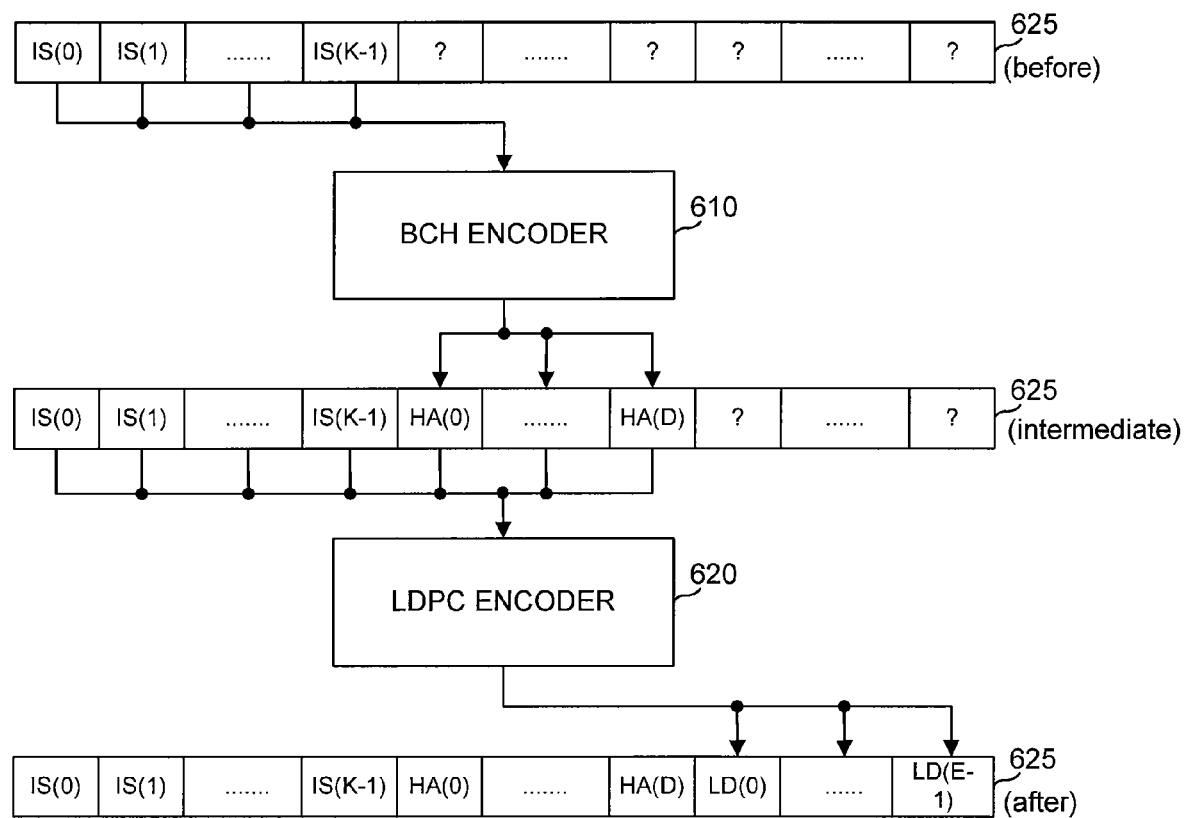
FIG. 8 illustrates an operation of one embodiment of the static encoder shown in FIG. 7.

FIG. 8 illustrates the operation of one embodiment of the present invention that employs the static encoder shown in FIG. 7. Particularly, BCH encoder 610 receives the input symbols from input symbol buffer 625 (or 205 as in FIG. 2), and generates D+1 BCH encoded redundant symbols, which are stored in input symbol buffer 625. Then, LDPC encoder 620 receives the input symbols and the D+1 BCH encoded redundant symbols from input symbol buffer 625, and generates E LDPC encoded redundant symbols, which are stored in input symbol buffer 625.

As described above, in some embodiments, LDPC encoder 620 receives static keys $S_0$, $S_1$, ... generated by static key generator 130 of FIG. 1. In one embodiment, static key generator 130 is a random number generator that generates a sequence of random-looking numbers (static keys $S_0$, $S_1$, ...) upon receipt of a seed. The seed can take a variety of forms. For example, it could be the value of a truly random number generator. As another example, the seed could be a string obtained in a deterministic way from a CPU clock. Whatever the seed is, it should be communicated to the decoder so that the same sequence of static keys can be generated by the decoder. It many applications, it will be therefore advantageous to have a seed which is not too large. In many applications the seed could be a 32-bit integer, or a 64-bit integer.

Referring again to FIG. 1, in some particular applications, the file or stream to be transmitted over channel 145 is rather small. For example, the input file could be a short audio message or the content of a web-page comprising some tens of kilobytes or a collection of a few thousand or fewer bits. The particular embodiments of a static encoder described above may be less than optimal in such scenarios. For instance, some of the above-described embodiments may lead to inefficient use of memory and processor speed, and hence slower reconstruction of the data. Also, some of the above-described embodiments may require a larger reception overhead to reconstruct the data within reliability parameters set by the user of the system. Additionally, some of the above-described embodiments may lead reconstruction of the data that is less reliable than desired.

It has been found that the failure probability of the decoder increases when the number of input symbols is decreased. It has also been found that this is largely because the encoding process does not create enough information about the original content if the size of the original content is relatively small. Therefore, another embodiment of an encoder is described, which generates redundant symbols that convey more information about the original symbols.

Figure 9:
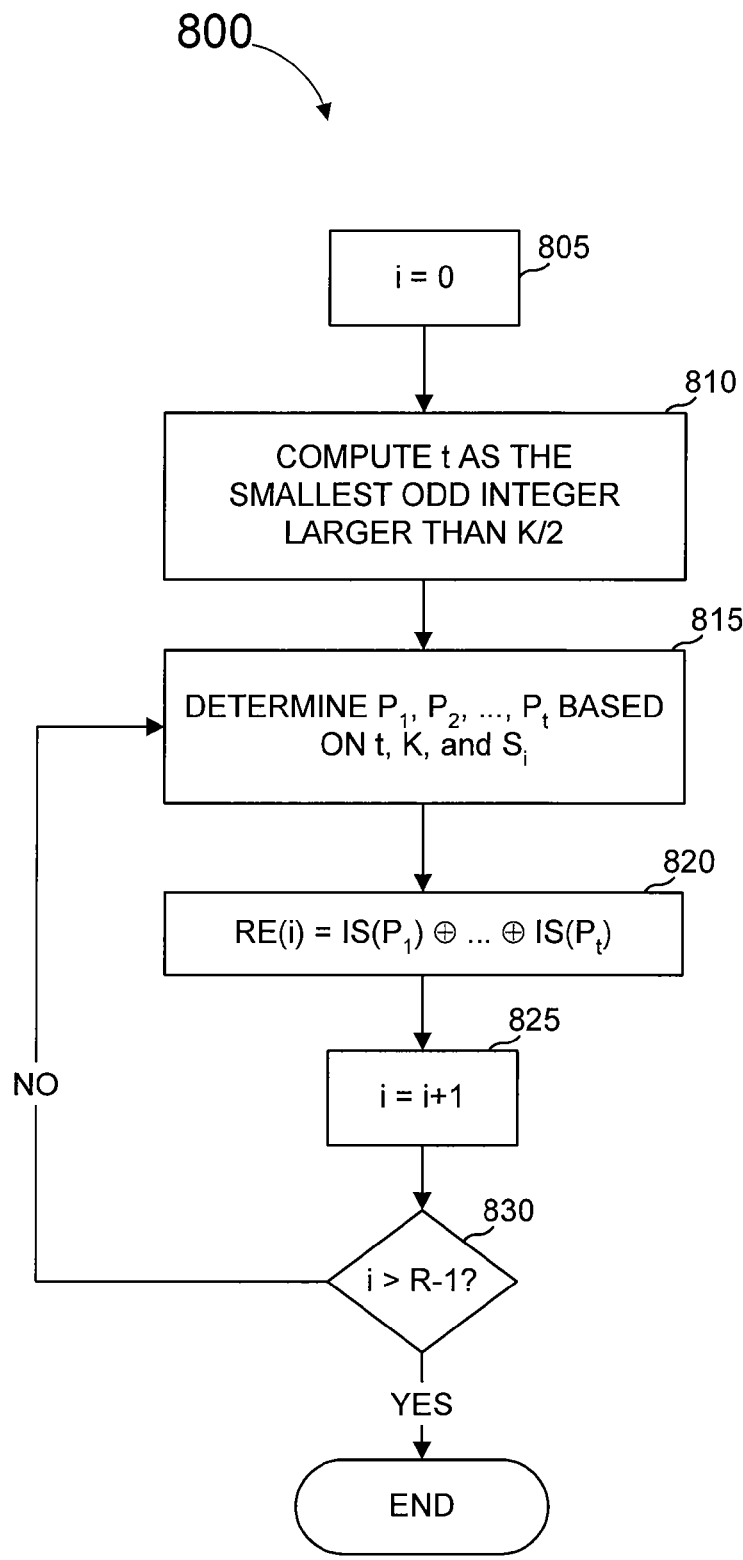
FIG. 9 is a simplified flow diagram of a static encoding process.

FIG. 9 is a simplified flow diagram of a process for encoding an encoder according to one embodiment of the present invention.

As shown there, in step 805, a variable i is initialized to zero. Variable i keeps track of the number of redundant symbols already generated. In step 810, a number t is calculated as the smallest odd integer greater than or equal to K/2. In step 815, values $P_1, P_2, \ldots, P_t$ are generated based on K, t, and a static key $S_i$. The values $P_1, P_2, \ldots, P_t$ indicate the positions of input symbols that will be used to generate a redundant symbol. In one particular embodiment, an associator such as associator 515 of FIG. 5 is used to generate $P_1, P_2, \ldots, P_t$. In particular, the value t can be provided as the W(I) input, the value K can be provided as the K+R input, and the static key $S_i$ can be provided as the key I input. It should be noted that many different values of t would yield similar coding effects, and thus this particular choice is only an example.

In step 820, the value of RE(i) is computed as the XOR of the values $IS(P_1), IS(P_2), \ldots, IS(P_t)$. In step 825, the variable i is incremented by one to prepare computation of the next redundant symbol, and in step 830, it is determined whether all the redundant symbols have been computed. If not, then the flow returns to step 815.

The Decoder

Figure 10:
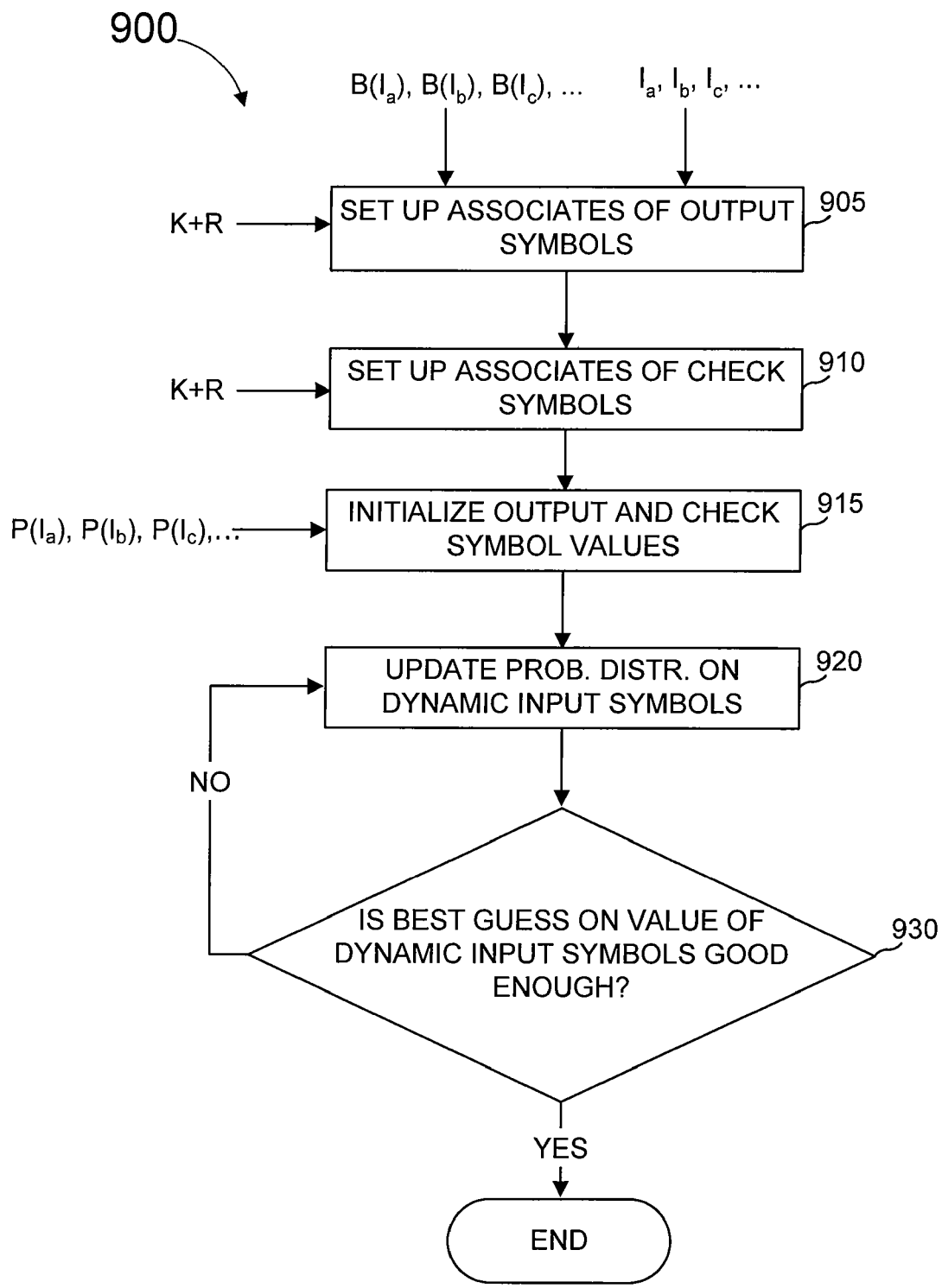
FIG. 10 is a simplified flow diagram of a decoding process as might be performed by a decoder such as the decoder of FIG. 1.

FIG. 10 is a simplified block diagram illustrating a decoding process according to the present invention, which can be implemented by a decoder such as decoder 155 of FIG. 1.

The process decodes the dynamic input symbols in stages. In step 905, the decoder sets up a list of associates of the received output symbols. This means that for every output symbol, the decoder computes a set of associated dynamic input symbols and stores the information in some table. To do so, the decoder may have access to the keys corresponding to the received output symbols, as well as to the number K of input symbols and the number R of redundant static symbols. In step 910, the decoder adds a list of check symbols together with their associates to the table of associates of output symbols. In preferred embodiments of the present invention, the check symbols represent dependencies among the dynamic input symbols. For example, if the associates of a check symbol are the dynamic input symbols with indices 10, 19, and 32, then this means that the XOR of the corresponding dynamic input symbols equals to a fixed value. In preferred embodiments of the present invention this value is zero, but this is by no means necessary.

At step 915, the process initializes the values of the check symbols and those of the output symbols. In this step, initialization means association of a probability distribution on the set of possible output symbol values and check symbol values to each individual output and check symbol, respectively. This probability distribution may be given with a small precision so as to increase the computational efficiency of the following steps. The assigned probabilities may also be zero for substantially many values of the output or check symbol alphabet. For example, in preferred embodiments of the present invention, where the check symbol's values are zero, the corresponding probability distributions assign a value of 1 to zero, and a value of 0 to any other element of the check symbol alphabet.

Steps 920 and 930 iteratively update the probabilities of the dynamic input symbols. There are several known algorithms for this task, such as a belief-propagation algorithm or some other variation such as the min-sum algorithm, or quantized belief-propagation algorithms. Generally, in these algorithms each connection between an output or check symbol and a dynamic input symbol carries two probability distributions, which are updated in every round. These probability distributions are regarded as messages that are passed back and forth during the algorithm. In the first round of the algorithm, the check and output symbols pass their own probability distributions to their associated dynamic input symbols. This specifies one set of messages on connections between the output and check symbols and the dynamic input symbols. In the next round, every dynamic input symbol calculates the second message for every such connection, based on messages it has received along all the other connections. Following this, every check or output symbol updates the first set of values on every connection based on the messages it has received from all the other connections, etc. At the end of every round, the dynamic input symbols calculate a best guess on their values based on the incoming probability distributions and determine whether or not they are reasonably certain about their values (step 930). If all the dynamic input symbols have acquired a predetermined level of certainty about their value, then the process terminates.

Several modifications of such a message passing process are possible. For example, if during the one or more iterations of the process, not all of the dynamic input symbols acquire enough certainty about their values, then these values may be set by the decoder, the probability distributions of the associated output and check symbols changed accordingly, and those dynamic input symbols can be removed from the decoding process. In certain cases, such a procedure may lead to substantial savings of computational resources. Another possible modification is to consider the dynamic output symbols and the check symbols separately, and use them in different stages of the decoding. In some embodiments such a time-division can be useful, and would allow for recovery of remaining errors using the static symbols that errors that may remain after processing all the dynamic output symbols. For example, the decoder may start by considering the dynamic output symbols only and not updating the values of the connections between the check and the input symbols. The values on these connections could be updated after the process is repeated a prescribed number of iterations, or after the decoder has reached a stationary state, or according to some other criteria.

A particular embodiment of the above decoder is now presented. In this embodiment the output symbol alphabet is the binary alphabet consisting of 0 and 1. A probability distribution on this alphabet can thus be described by a single nonnegative real number p which is assumed to be the probability of obtaining a 1. The messages passed between associated dynamic input symbols and output and check symbols can be arbitrary real numbers, augmented by two particular messages Inf and —Inf representing numbers such that —Inf is smaller than any other number and Inf is larger than any other number. In this case, every output symbol has been received with an associated number describing the probability that the output symbol was 1 prior to transmission. Step 915 initializes these values for every output symbol, and additionally initializes the values of the check symbols to 0 (meaning that the check symbol's values are 0 with probability 1).

The update rule in this case is as follows: in the first round, every output or check symbol sends its initial value to its associated dynamic input symbols. From this point on, every dynamic input symbol sends to its associated output or check symbol S the following value: For all associated symbols other than S, the dynamic input symbol receives a probability p, calculates $\ln(p/(1-p))$, sums up these numbers to obtain a number t, and sends $1/(\exp(t)+1)$ to S, where $\ln(x)$ is the natural logarithm of x, and $\exp(x)$ is the exponential function of x. In the next round, every output or check symbol sends to its associated dynamic input symbol I the following value: it collects all the incoming numbers from all the associated dynamic input symbols other than I, and for each such number a computes $1-2*a$, multiplies these numbers, and multiplies the result with $1-2*z$ to obtain a number b, where z is the initial value of the symbol, and sends $(1-b)/2$ to I.

The above process uses the well-known belief-propagation algorithm, so need not be described here in greater detail. Other variations might be used instead.

Figure 11:
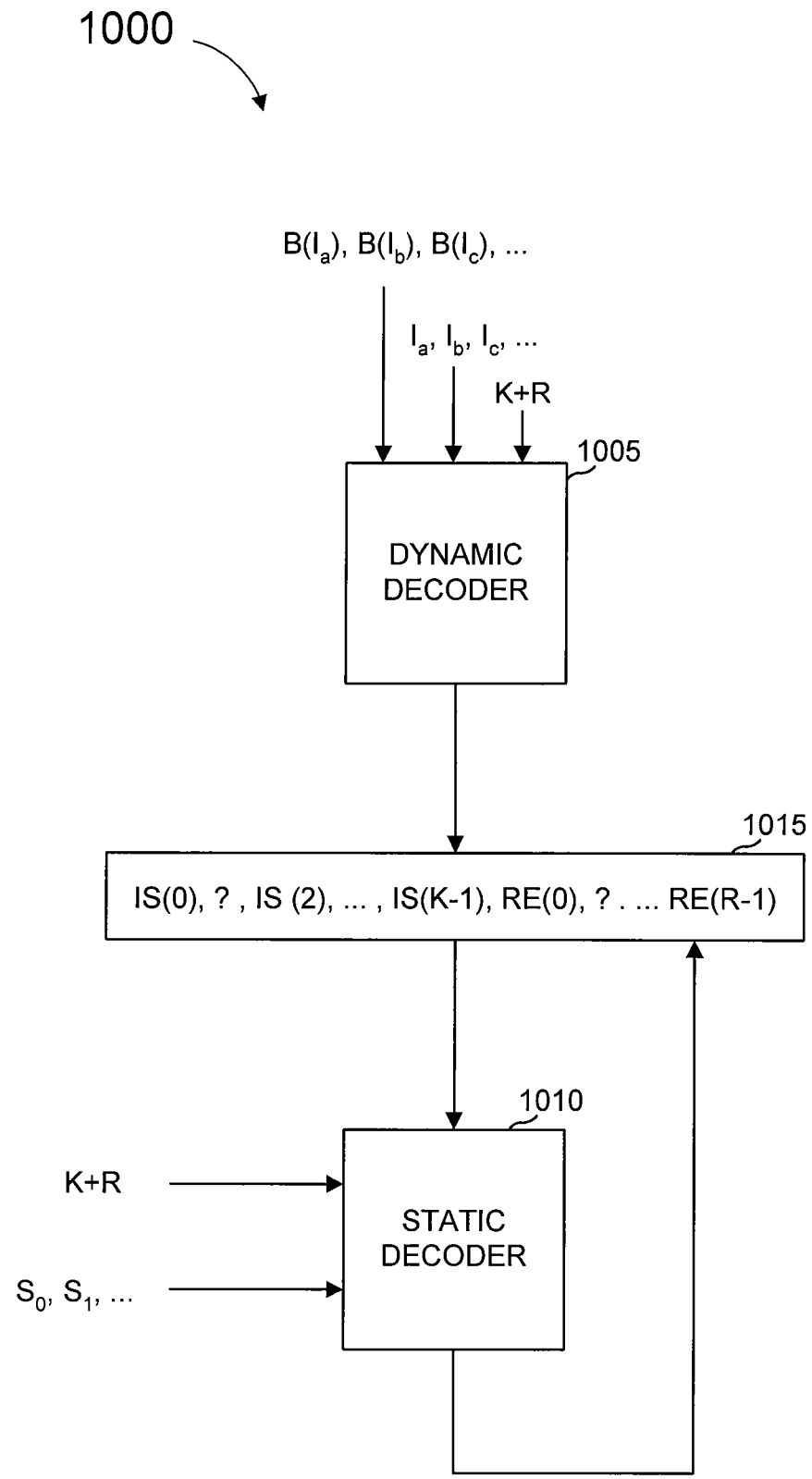
FIG. 11 is a block diagram of an alternative decoder.

A different embodiment of decoder 155 is exemplified in FIG. 11. It comprises a dynamic decoder 1005 and a static decoder 1010. Dynamic decoder 1005 receives the output symbols $B(I_a), B(I_b), \ldots$, from receive module 150 in FIG. 1, and dynamic keys $I_a, I_b, I_c, \ldots$ from dynamic key regenerator 160. Upon reception of these data, dynamic decoder 1005 attempts to reconstruct the input symbols $IS(0), \ldots, IS(K-1)$ and the redundant symbols $RE(0), \ldots, RE(R-1)$. The reconstruction may proceed in the same manner as described for the general decoder, by employing, for example, the belief-propagation algorithm or any of its variants. One advantage of some embodiments of the present invention is that dynamic decoder 1005 need not finish the decoding all of the input symbols. Rather, static decoder 1010 can be used to decode input symbols that dynamic decoder 1005 did not recover. This can be particularly useful when the decoder uses a time-division strategy in the manner described above.

The probability distributions corresponding to the input symbols and redundant symbols obtained by dynamic decoder 1005 are stored in a reconstruction buffer 1015. Upon completion of dynamic decoding, static decoder 1010 attempts to recover any input symbols not recovered by dynamic decoder 1005, if any. In particular, static decoder 1010 receives input symbols and redundant symbols from reconstruction buffer 1015. Additionally, static decoder 1010 receives static keys $S_0, S_1, S_2, \ldots$, if used, from static key generator 163 (FIG. 1). Referring again to FIG. 1, in one specific embodiment, the static keys can be regenerated by communicating a common seed used by random number generator 135 through communication channel 145 to random number generator 164 which drives static key generator 163.

The recovered input symbols are provided to input file reassembler 165. The static decoder may follow the same principles as the other decoders described here. In some embodiments of the present invention, it may however be preferable to use a faster decoding algorithm for the static decoder, such as the bit-flipping decoder known to those of skill in the art. In some cases, for example when static encoding comprises a traditional code such as a BCH code, the static decoding process may comprise two different decoders, one for the LDPC code, if such a code is used, and one for the BCH code. The decoder for the LDPC code may be the belief-propagation decoder or any of its variants, or it can be any other efficient decoding algorithm such as the bit-flipping algorithm. The decoder for the BCH code may be the standard decoder employing the Berlekamp Massey algorithm as known to those of skill in the art, or it may also be a belief-propagation decoder.

Figure 12:
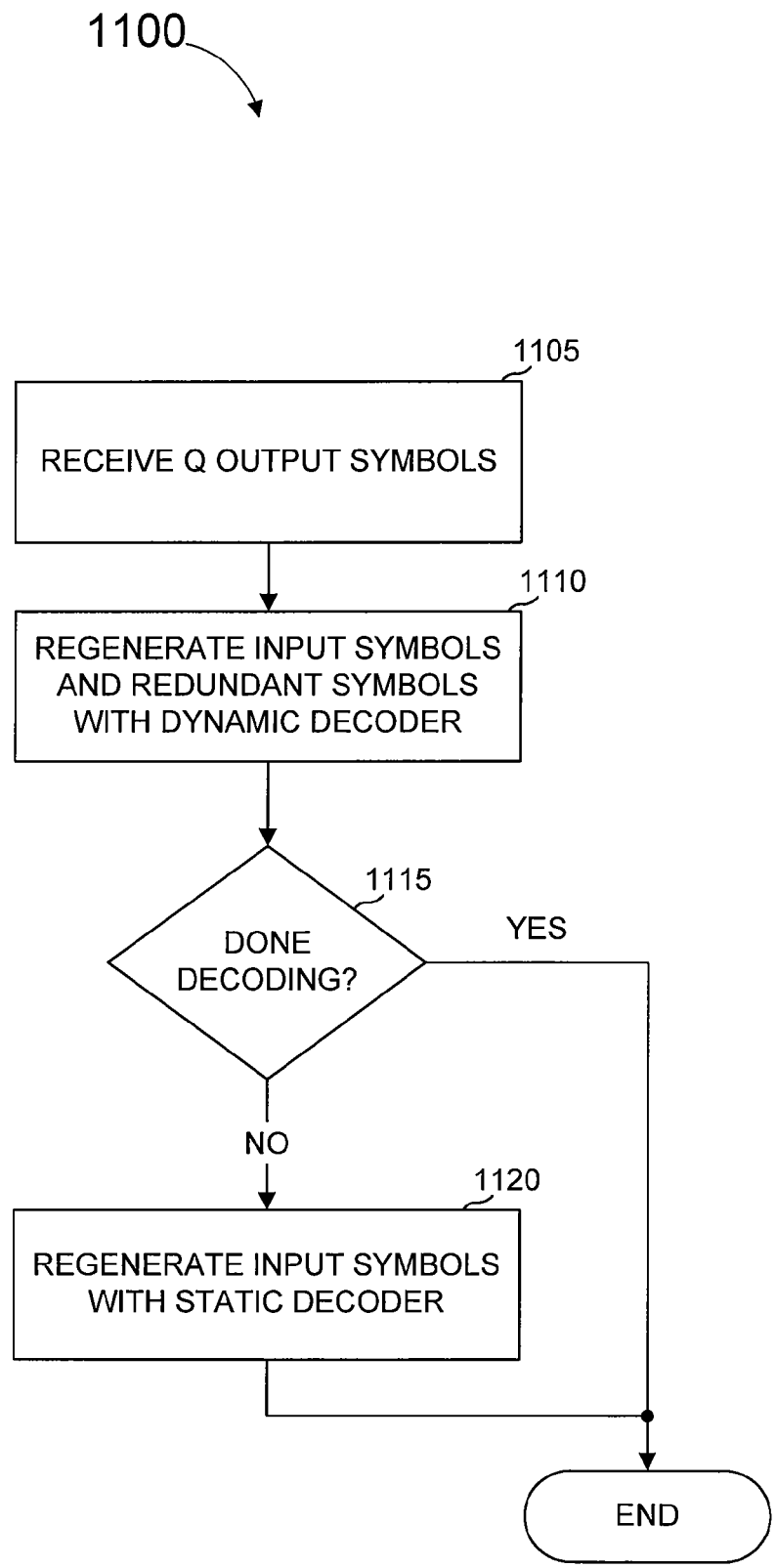
FIG. 12 is a simplified flow diagram illustrating one method for decoding.

FIG. 12 is a simplified flow diagram illustrating one embodiment of a method for decoding according to the present invention. In step 1105, Q output symbols are received by the decoder. The value of Q can depend on the number of input symbols and the specific dynamic encoder used. This value may have been forwarded by the receive module, such as receive module 150, whose workings will be described in more detail below. The value of Q can also depend on the desired degree of accuracy to which the decoder can recover the input symbols. For example, if it is desired that the decoder can recover all of the input symbols with a high probability, then Q should be chosen as larger than the number of input symbols. Particularly, in some applications, when the number of input symbols is large, Q can be less than 3% larger than the number of original input symbols. In other applications, when the number of input symbols is small, Q could be 10% larger than the number of input symbols. If it is acceptable for the decoder to be unable to decode all of the input symbols, then Q can be less than the number of input symbols. Clearly, one aim of an overall coding system will often be to decrease the number Q as much as possible, while maintaining good probabilistic guarantees on the success of the decoding process.

In step 1110, a dynamic decoder, such as dynamic decoder 1005, regenerates input symbols and redundant symbols from the Q received output symbols. It is to be understood, that steps 1105 and 1110 can be performed substantially concurrently. For example, the dynamic decoder can begin regenerating input symbols and redundant symbols prior to the decoder receiving Q output symbols.

After the dynamic decoder has processed Q output symbols, then it is determined whether the input symbols have been recovered to a desired degree of accuracy. The desired degree of accuracy may be, for example, all of the input symbols, or some number, percentage, etc. less than all of the input symbols, or some acceptable probability for specific dynamic input symbols if belief-propagation or any other soft decision decoding method is used. If yes, then the flow ends. If no, then the flow proceeds to step 1120. In step 1120, a static decoder, such as static decoder 1010, attempts to recover any input symbols that the dynamic decoder was unable to recover. After the static encoder has processed the input symbols and redundant symbols recovered by the dynamic encoder, then the flow ends.

Figure 13:
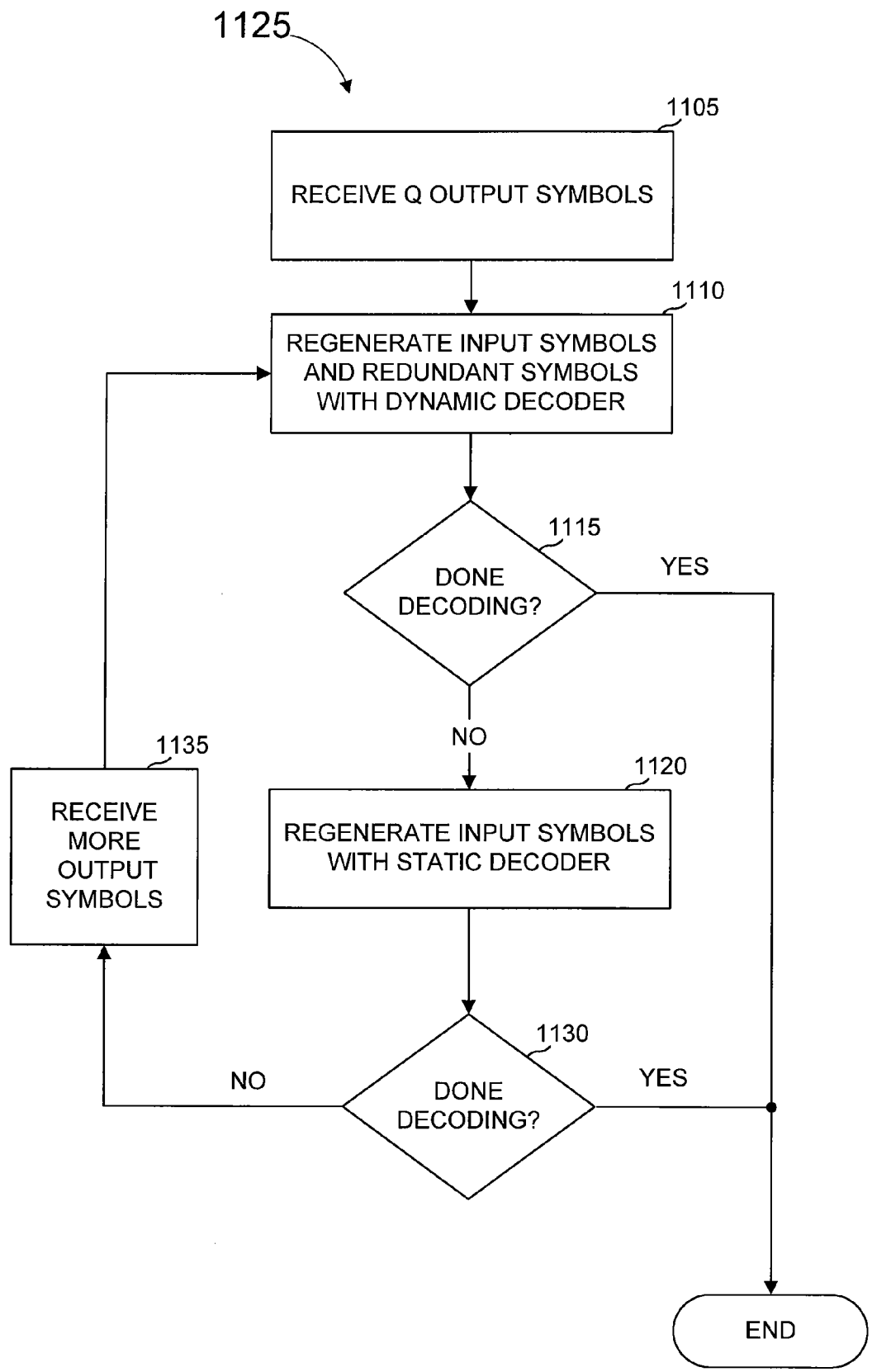
FIG. 13 is a simplified flow diagram illustrating an alternative method for decoding.

FIG. 13 is a simplified flow diagram illustrating another embodiment of a method for decoding according to aspects of the present invention. This embodiment is similar to that described with respect to FIG. 12, and includes steps 1105, 1110, 1115, and 1125 in common. But, after step 1125, the flow proceeds to step 1130, in which it is determined whether the input symbols have been recovered to a desired degree of accuracy. If yes, then the flow ends. If no, then the flow proceeds to step 1135. In step 1135, one or more additional output symbols are received. Then, the flow proceeds back to step 1110, so that the dynamic decoder and/or the static decoder can attempt to recover the remaining unrecovered input symbols.

Figure 14:
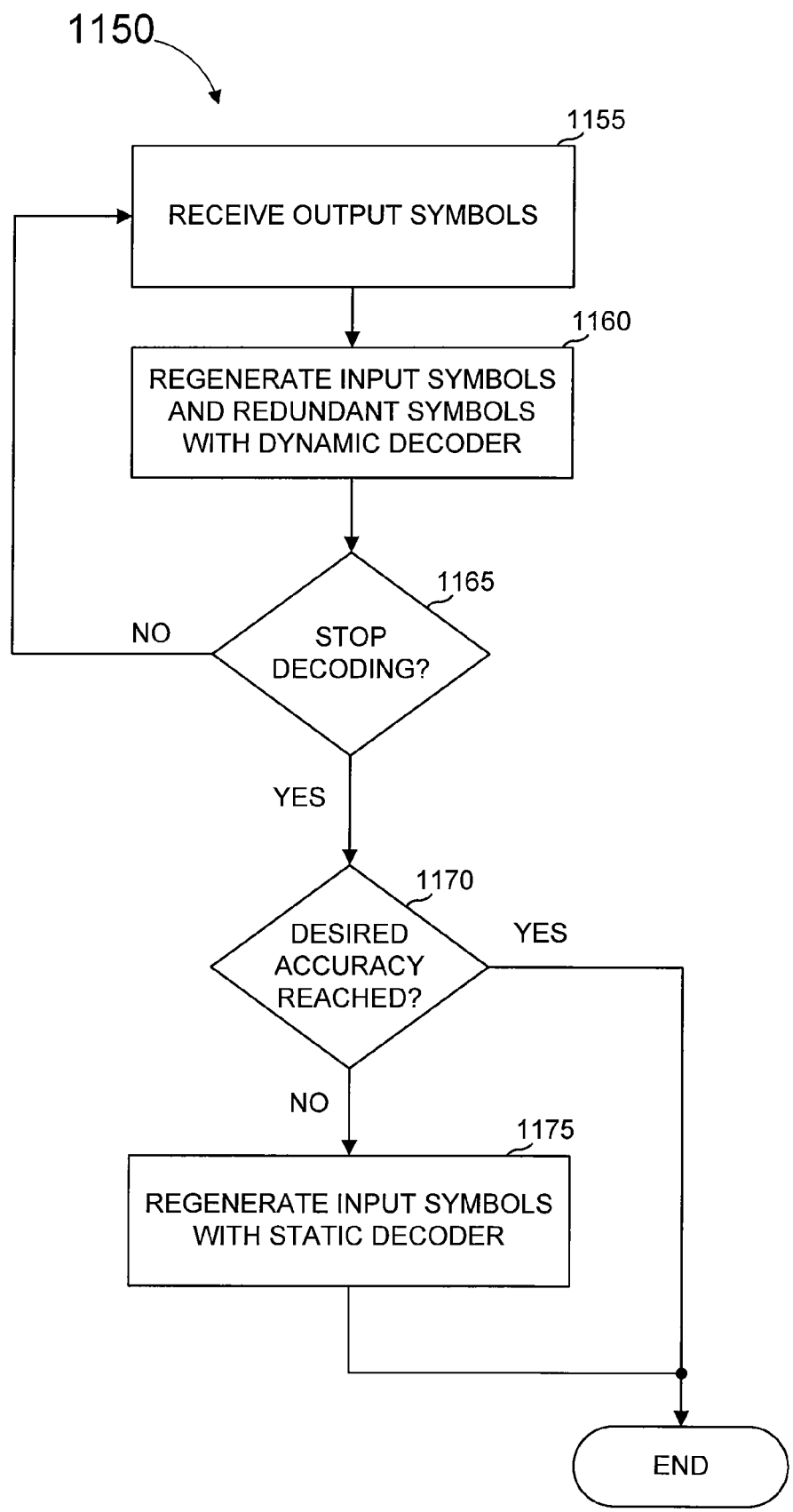
FIG. 14 is a simplified flow diagram illustrating yet another alternative method for decoding.

FIG. 14 is a simplified flow diagram illustrating yet another embodiment of a method for decoding according to the present invention. This embodiment relates to the time-division procedure described above. In step 1155, output symbols are received by a decoder, and in step 1160, a dynamic decoder regenerates input symbols and redundant symbols from the received output symbols. Then, in step 1165, it is determined whether dynamic decoding should be ended. This determination can be based on one or more of the number of output symbols processed, the number of input symbols recovered, the current rate at which additional input symbols are being recovered, the time spent processing output symbols, etc. It is to be understood, that steps 1155, 1160 and 1165 can be performed substantially concurrently. For example, the dynamic decoder can begin regenerating input symbols and redundant symbols as the decoder continues to receive output symbols. Additionally, an evaluation of whether to stop the dynamic decoding process can be performed periodically while output symbols are being received and/or while output symbols are being processed by the dynamic decoder.

In step 1165, if it is determined that dynamic decoding is not to be stopped, then the flow proceeds back to step 1155. But, if in step 1165 it is determined to end dynamic decoding, then the flow proceeds to step 1170. In step 1170, it is determined whether the input symbols have been recovered to a desired degree of accuracy. If yes, then the flow ends. If no, then the flow proceeds to step 1175. In step 1175, the static decoder attempts to recover any input symbols that the dynamic decoder was unable to recover. After the static encoder has processed the input symbols and redundant symbols recovered by the dynamic encoder, the flow ends.

The Receive Module

With reference to FIG. 1, a main task of receive module 150 is to receive the output symbols from the channel, calculate probability distributions for the symbols, and forward this information together with the keys of the output symbols to the decoder. In some embodiments, the receive module also calculates an estimate on the amount of information that the received output symbols contain about the unknown input symbols, and it may use this estimate to discontinue reception of further output symbols when the cumulative information of the output symbols is sufficient to recover the input symbols. This estimate may be very coarse (for example, just an indication of whether the value is "correct" or "incorrect") or very fine (for example, the probability that the symbol's value is a given value from the input alphabet). The estimate might itself be erroneous, especially when the estimate is very coarse.

In practice, the probability distributions can be estimated based on the strength and intensity of the communications signals representing the output symbols. For example, such data may be obtained from demodulation techniques. As an example, suppose that every output symbol consists of two bits, which are modulated using a Quaternary Phase Shift Keying (QPSK) method, and the phase of the incoming carrier wave is estimated to be z. Then a probability distribution may be obtained for the value of the output symbol prior to transmission, in which the probability of any of the four values is proportional to the distance of the corresponding QPSK constellation from the received phase z or some function of the distance. This probability distribution may also incorporate terms that take into account the intensity or other physical characteristics of the signal.

While it might be simplest to have each output symbol comprise one symbol modulated on a carrier, such as each output symbol coding for two bits in a QPSK modulation scheme, the present invention need not be limited to such cases. For example, one output symbol could code for two or more modulation symbols, such as each output symbol comprising four QPSK modulation symbols. In that example, each output symbol would code for eight bits and could have a probability distribution of as many as 63 values (assuming 64 possible bit sequences that could have been coded by the received output symbol, less one since it can be calculated as one less the sum of the other 63 values).

Once the probability distribution is obtained, an estimate the amount of information in the output symbol can be calculated as the binary entropy of the probability distribution. In other words, if the distribution assigns masses of $p_1$, $p_2, \ldots, p_m$ to the m possible configurations of the output symbol prior to transmission, then the corresponding amount of information in the symbol equals $1+p_1*\log(p_1)+p_2*\log(p_2)+\ldots+p_m*\log(p_m)$, where $\log(x)$ is the binary logarithm of x. As mentioned above, the receive module may add the amounts of information in every incoming output symbol to obtain an estimate on the total amount of information that the output symbols convey about the input symbols.

An Associator Implementation

Referring again to FIG. 5, one embodiment of associator 515 is shown and is similar to associators such those described in Luby I. Thus, where N is K+R, the value at the N input should be a prime number. In operation, when this embodiment is used to compute AL(I), the input size K+R is adjusted so that it is prime. In preferred embodiments, the number of redundant symbols is chosen large enough so that K+R is prime. In some applications, the condition that the N input is a prime is rather restrictive.

Figure 15:
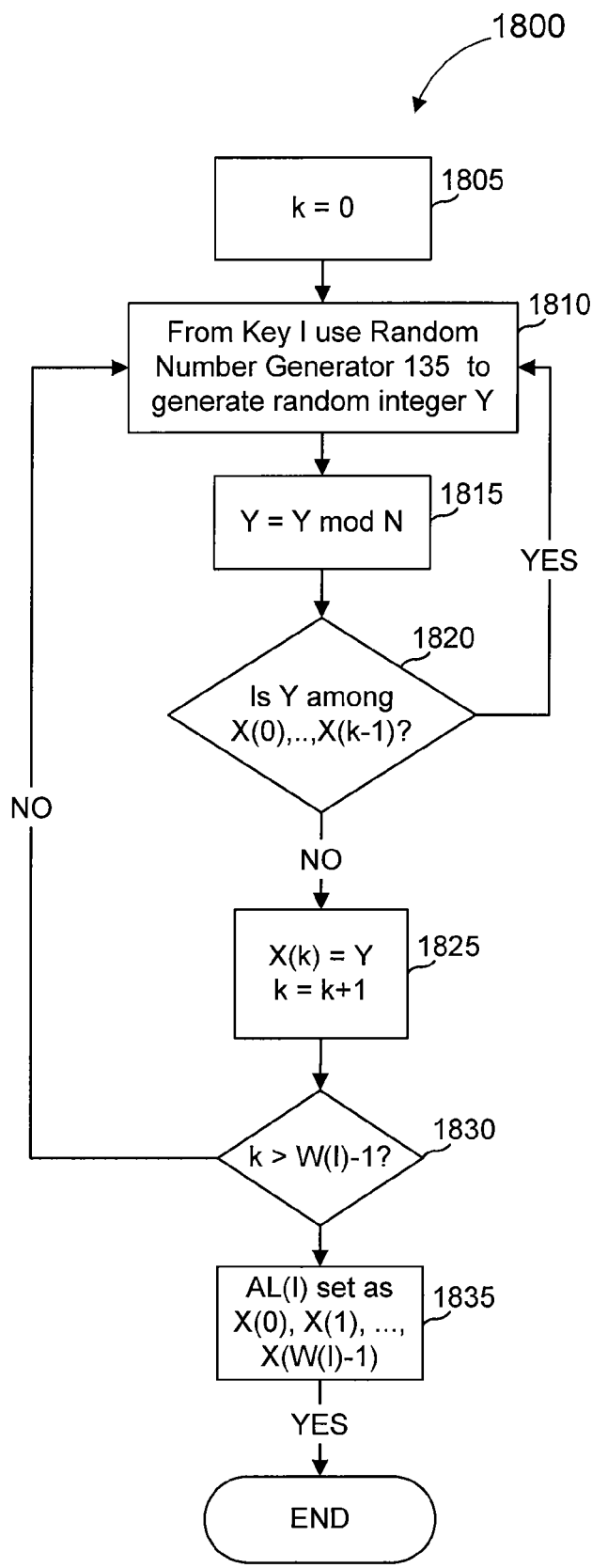
FIG. 15 is a flow diagram illustrating a process for generating association lists as might be used by the dynamic encoder of FIG. 5.

A method for implementing an associator for which N need not be a prime number is shown in FIG. 15. First, in a step 1805, a variable k is initialized to zero. Then, in a step 1810, a random integer Y is generated. In one specific embodiment, the key I for the output symbol is used to seed a random number generator. Then, in step 1815, the integer Y is taken modulo the number N to produce a number between 0 and N−1. In step 1820, the candidate number Y is tested against other numbers Y previously generated (X(0), X(1), . . . ). If the number Y had been previously generated, then the flow returns to step 1810. Otherwise, in step 1825, it is included in a list X(0), X(1), . . . Then, in step 1830, it is determined whether W(I) numbers have been generated. If not, then the flow returns to step 1810. The result of the flow illustrated in FIG. 15 is a list of W(I) numbers X(0), X(1), . . . X(W(I)−1), where each number X in the list is a unique integer between 0 and N−1. Then, in a step 1835, the list AL(I) is set as the numbers X(0), X(1), . . . , X(W(I)−1).

A Weight Selector Implementation

The performance and efficiency of the encoder/decoder is dependent on the distribution of weights of the output symbols generated by dynamic encoder 220 as shown in FIG. 2, and some distributions are better than others. In particular, the choice of the parameter A describing the excess of the number of collected output symbols compared to the number K of input symbols is primarily affected by the choice of the weight distribution. The operational aspects of weight selection are discussed below, followed by a description of some important weight distributions. The block diagram of FIG. 16 and the flow diagram of FIG. 17 are used to illustrate these concepts.

The task of weight selector 510 shown in FIG. 5 is the following: upon reception of a key I, and a length K+R, the weight selector outputs an integer W(I) in the range 0 through K+R−1, called the weight. Unlike associator 515, which ideally generates integers uniformly at random, the output of the weight selector 510 is desirably not uniform but skewed in favor of certain weights, as is described below.

Figure 16:
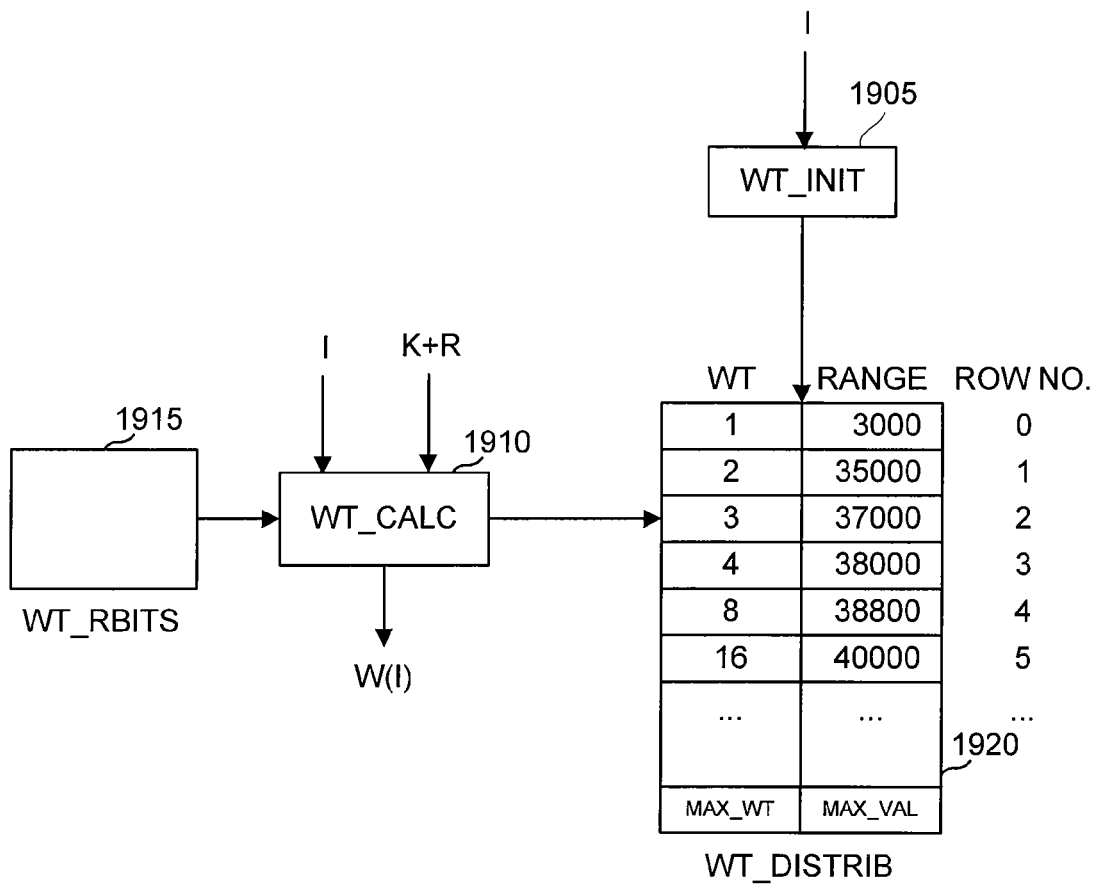
FIG. 16 is a block diagram showing the weight selector of FIG. 5 in greater detail.
Figure 17:
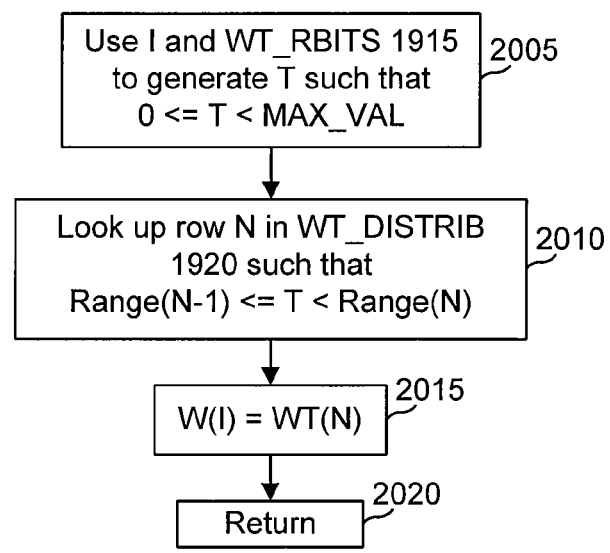
FIG. 17 is a flowchart of a process that might be used by a weight selector, such as the weight selector shown in FIG. 16, to determine the weight for a given output symbol.

As shown in FIG. 16, weight selector 510 comprises two processes WT_INIT 1905 and WT_CALC 1910, and two tables WT_RBITS 1915 and WT_DISTRIB 1920. Process WT_INIT 1905 need be invoked only once when the first key is passed in to initialize table WT_DISTRIB 1920. The design of WT_DISTRIB 1920 is an important aspect of the system, and is considered later in much more detail. Process WT_CALC 1910 is invoked on each call to produce a weight W(I) based on a key I. As shown in the flow diagram of FIG. 17, WT_CALC 1910 uses the key I and random bits stored in table WT_RBITS 1915 to generate a random number T (2005). Then, the value of T is used to select a row number N in table WT_DISTRIB 1920.

As shown in FIG. 16, the entries in the RANGE column of WT_DISTRIB 1920 are an increasing sequence of positive integers ending in the value MAX_VAL, and the WT column is an increasing sequence of positive integers ending in the value MAX_WT. The set of possible values for T are the integers between zero and MAX_VAL−1. A desirable property is that T is equally likely to be any value in the range of possible values. The value of N is determined by searching the RANGE column until an N is found that satisfies RANGE(N−1)≦T<RANGE(N) (2010). Once an N is found, the value of W(I) is set to WT(N), the N-th entry of the WT column of the table WT_DISTRIB, and this is the returned weight (2015, 2020). In FIG. 16, for the example table shown, if T is equal to 38,500, then N is found to be 4, and thus W(I) is set to WT(4)=8.

Selecting a Weight Distribution

The main preferred optimization parameters for the coding process are such that an input file can be fully reconstructed with: a) as few output symbols as possible, b) as few operations as possible, and c) as much reliability as possible. Typically, all these optimization criteria can be met by the right choice of the weight distribution for output symbols, i.e., the distribution of W(I) over all I, and the distribution of associates over the output symbols, i.e., the memberships of AL(I) over all I. It should be emphasized that while the decoding process can be applied regardless of the weight distribution and the distribution on the choice of the associates, the preferred embodiments will use weight distributions and distributions on the choice of associates specifically chosen for near optimal performance. In fact, many distributions will perform well, as small variations in the chosen distribution may lead to only small changes in performance.

One methodology for determining the distributions in one preferred embodiment uses the technique of density evolution as those skilled in the art are familiar with. Another method for designing the weight distributions uses Gaussian approximations, and the design problem can be transformed into a problem that is solvable using linear programming methods. Such methods could be used by components that generate weight distributions for use with the present invention.

One such weight distribution will now be described. The weight distribution is given as a table of the form shown in Table 1 where P1 is the probability of an output symbol having weight W1, P2 is the probability of an output symbol having weight W2, etc., and where the sum of P1, P2, . . . is 1.

TABLE 1

| Weight | Probability |
| --- | --- |
| W1 | P1 |
| W2 | P2 |

TABLE 1-continued

| Weight | Probability |
| --- | --- |
| W3 | P3 |
| ... | ... |

With such a distribution, the table WT_DISTRIB 1920 of FIG. 16 would have a form such as shown in Table 2.

TABLE 2

| Row # | Weight | Range |
| --- | --- | --- |
| 0 | W1 | MAX_VAL*P1 |
| 1 | W2 | MAX_VAL*P2 |
| 2 | W3 | MAX_VAL*P3 |
| ... | ... | ... |

A sample distribution tested has the form shown in Table 3.

TABLE 3

| Weight | Probability |
| --- | --- |
| 1 | 0.01000 |
| 2 | 0.42494 |
| 3 | 0.25195 |
| 4 | 0.03576 |
| 5 | 0.12321 |
| 10 | 0.09027 |
| 39 | 0.04772 |
| 40 | 0.01894 |

The distribution of Table 3 (not equal to 1.0000 due to rounding) performs rather well in practice. For example, from 10000 runs on an input size of length 1000, the decoder failed to decode the input symbols in only 4 runs. The static code used in this case was an LDPC code with message degree equal to 4, and check degrees that were binomially distributed. The rate of the static code was 0.97. The number of output symbols collected divided by the optimal number of output symbols was equal to 1.2; this translates to a reception overhead of 20%.

Another methodology for determining the distributions in one preferred embodiment is to use the same or similar degree distributions as those in Luby I or Shokrollahi I. While these distributions have been optimized for a transmission channel in which there is only expectation of erasures, but not of errors or garbled data, they exhibit good performance in simulations nonetheless. For example, the distribution given in Table 4 allows for fully correcting K input bits with probability at least $1-10^{(-6)}$ on a communications channel in which the input alphabet comprises two bits and the corruption is caused by a Gaussian random variable with mean 0 and standard deviation sigma, for values of K in excess of 65536, for sigma in the range of 0-2, and with an overhead of less than 10%.

TABLE 4

| Weight | Probability |
| --- | --- |
| 1 | 0.008 |
| 2 | 0.494 |
| 3 | 0.166 |
| 4 | 0.073 |
| 5 | 0.083 |
| 8 | 0.056 |
| 9 | 0.037 |
| 19 | 0.056 |

TABLE 4-continued

| Weight | Probability |
| --- | --- |
| 65 | 0.025 |
| 66 | 0.003 |

Systematic Encoding of EC-MS codes

The teachings of SED-CRC can be used to design a systematic encoder for EC-MS codes. Here, the input symbols are first decoded using a sequence of systematic keys to generate a sequence of intermediate input symbols. Next, a multi-stage code is applied to the sequence of intermediate input symbols to generate output symbols, some of which constitute the original input symbols. In the next step, the received output symbols are decoded using the methods described herein to recover the sequence of intermediate input symbols. Thereafter, the sequence is encoded again using the systematic keys to obtain the sequence of input symbols.

In some embodiments, an encoder that is like a multi-stage encoder such as that described in Shokrollahi I, but operating on bits rather than packets, is used. In some other embodiments, single-stage codes, such as those shown in Luby I, might be combined with probability distribution accumulation in a receiver.

The invention has now been described with respect to specific embodiments, and it should be appreciated that the invention is intended to cover all modifications and equivalents within the scope of the following claims.

What is claimed is:

1. A method of receiving data transmitted from a source over a communications channel, wherein the data is transmitted as a plurality of output symbols and is generated from at least one symbol in a combined set of input symbols and redundant symbols, wherein the number of valid output symbols for a given set of symbols in the combined set that can be generated is independent of the number of input symbols obtained from the source, wherein the input symbols are from an ordered set of input symbols, and wherein the redundant symbols are generated from the input symbols, the method comprising:
    upon receiving at least a subset of the output symbols from the communications channel, determining at least estimates of output symbol probability distributions, wherein an output symbol probability distribution represents probabilities, given a received output symbol, that a particular output symbol was transmitted;
    determining, from the estimates or values of output symbol probability distributions, input symbol probability distributions, wherein an input symbol probability distribution represents probabilities of particular input symbols having been encoded to form the received output symbols;
    regenerating at least a subset of the symbols in the combined set from the received output symbols, the subset of the symbols in the combined set including at least one regenerated input symbol or at least one regenerated redundant symbol; and
    upon receiving at least a subset of the output symbols, regenerating at least a subset of the symbols in the combined set from the output symbols, the subset of the symbols in the combined set including at least one regenerated input symbol or at least one of regenerated redundant symbol, wherein the steps of regenerating use the input symbol probability distributions.

2. The method of claim 1, further comprising:
for received output symbols, determining an information quantity associated with the received output symbol;
accumulating a total information quantity associated with a plurality of received output symbols; and
when the accumulated total information quantity meets predefined criteria relative to an information content quantity of the ordered set of input symbols, triggering one or more of the steps of regenerating.

3. The method of claim 2, wherein the predefined criteria includes a criterion that the accumulated total information is equal to the information content quantity of the ordered set of input symbols plus a small additional amount of information.

4. The method of claim 1, wherein output symbol probability distributions are each a probability distribution over each of two possibilities, representable as a single probability.

5. The method of claim 1, wherein output symbol probability distributions comprise probability values having coarse quantization in one decoding phase and finer quantization in another decoding phase.

6. The method of claim 1, wherein output symbol probability distributions comprise probability values each taking on one of two values, with one of the values representing a high probability and the other representing a low probability.

7. The method of claim 1, wherein output symbol probability distributions represent probability per bit of an output symbol indicating a probability that the bit was a one or a zero at transmission.

8. The method of claim 1, wherein output symbol probability distributions represent probability over all bits of an output symbol indicating a probability for each possible value at transmission of the output symbol.

9. The method of claim 1, wherein output symbol probability distributions represent probability over data symbol values that are used to convey output symbols.

10. The method of claim 1, wherein the probability distribution is stored as a data structure not including entries for possible transmitted bits or symbols when the estimated probability is zero.

11. The method of claim 1, wherein each output symbol is associated with a key I selected from a key alphabet and the number of possible keys in the key alphabet can be independent of the number of input symbols in the input file.

12. The method of claim 1, wherein the redundant symbols include a first plurality of redundant symbols and a second plurality of redundant symbols, wherein the step of regenerating at least some of the unregenerated input symbols includes:
regenerating, from the regenerated redundant symbols of the first plurality of redundant symbols and the plurality of regenerated input symbols, at least one of the unregenerated input symbols and unregenerated redundant symbols of the second plurality of redundant symbols; and
if the step of regenerating from the regenerated redundant symbols of the first plurality of redundant symbols and the plurality of regenerated input symbols does not regenerate the input symbols to a desired degree of accuracy, regenerating at least one unregenerated input symbol from redundant symbols of the second plurality of redundant symbols and the plurality of decoded input symbols.

13. The method of claim 12, wherein some of the unregenerated input symbols and unregenerated redundant symbols of the second plurality of redundant symbols is regenerated using an LDPC decoder; and wherein the some input symbol is regenerated from redundant symbols of the second plurality of redundant symbols using a Hamming decoder.

14. The method of claim 1, wherein error correction is done by keeping track of probability estimates for more than one possibility for a given input symbol and then selecting the highest probability estimate.

15. A receiver that receives data transmitted from a source over a communications channel, wherein the data is transmitted as a plurality of output symbols generated from at least one symbol in a combined set of input symbols and redundant symbols such that the number of valid output symbols for a given set of symbols in the combined set that can be generated can be independent of the number of input symbols obtained from the source wherein the input symbols are from an ordered set of input symbols, and wherein the redundant symbols are generated from the input symbols, the receiver comprising:
a digitizing input as part of a receive module that digitizes a signal received from the communications channel possibly altered from what was transmitted by the source resulting in errors and/or erasures;
logic for associating portions of the received signal thus digitized to at least a subset of received output symbols;
logic for determining at least estimates of output symbol probability distributions for the received output symbols, wherein an output symbol probability distribution represents probabilities, given a received output symbol, that a particular output symbol was transmitted;
logic for determining, from the estimates or values of output symbol probability distributions, input symbol probability distributions, wherein an input symbol probability distribution represents probabilities of particular input symbols having been encoded to form the received output symbols;
logic for regenerating at least a subset of the symbols in the combined set from the received output symbols, the subset of the symbols in the combined set including at least one regenerated input symbol or at least one regenerated redundant symbol; and
logic for regenerating at least a subset of the symbols in the combined set from a received subset of the output symbols, the subset of the symbols in the combined set including at least one regenerated input symbol or at least one regenerated redundant symbol, using the input symbol probability distributions.

16. The receiver of claim 15, further comprising:
logic for determining an information quantity associated with the received output symbol;
logic for accumulating a total information quantity associated with a plurality of received output symbols; and
logic for triggering one or more of the steps of regenerating when the accumulated total information quantity meets predefined criteria relative to an information content quantity of the ordered set of input symbols.

17. The receiver of claim 16, wherein the predefined criteria includes a criterion that the accumulated total information is equal to the information content quantity of the ordered set of input symbols plus a small additional amount of information.

18. The receiver of claim 15, wherein output symbol probability distributions are each a probability distribution over each of two possibilities, representable as a single probability.

19. The receiver of claim 15, wherein output symbol probability distributions comprise probability values having coarse quantization in one decoding phase and finer quantization in another decoding phase.

20. The receiver of claim 15, wherein output symbol probability distributions comprise probability values each taking on one of two values, with one of the values representing a high probability and the other representing a low probability.

21. The receiver of claim 15, wherein output symbol probability distributions represent probability per bit of an output symbol indicating a probability that the bit was a one or a zero at transmission.

22. The receiver of claim 15, wherein output symbol probability distributions represent probability over all bits of an output symbol indicating a probability for each possible value at transmission of the output symbol.

23. The receiver of claim 15, wherein output symbol probability distributions represent probability over data symbol values that are used to convey output symbols.

24. The receiver of claim 15, wherein the probability distribution is stored as a data structure not including entries for possible transmitted bits or symbols when the estimated probability is zero.

25. The receiver of claim 15, further comprising:
a key generator that generates a key I selected from a key alphabet for each output symbol, wherein the number of possible keys in the key alphabet can be independent of the number of input symbols in the input file; and
a decoder that determines which input symbols are associated with a received output symbol based on the output symbol's key.

26. The receiver of claim 15, wherein the redundant symbols include a first plurality of redundant symbols and a second plurality of redundant symbols and the receiver regenerates at least some of the unregenerated input symbols from the regenerated redundant symbols of the first plurality of redundant symbols and the plurality of regenerated input symbols, at least one of the unregenerated input symbols and unregenerated redundant symbols of the second plurality of redundant symbols.

27. The receiver of claim 26, further comprising:
an LDPC decoder for regenerating some of the unregenerated input symbols and unregenerated redundant symbols of the second plurality of redundant symbols; and
a Hamming decoder for regenerating some of the input symbols from redundant symbols of the second plurality of redundant symbols.

28. The receiver of claim 15, further comprising an error correction monitor as part of a dynamic decoder that tracks probability estimates for more than one possibility for a given input symbol and selects the highest probability estimate.

* * * * *